United States Patent
Yap

(10) Patent No.: US 10,128,399 B1
(45) Date of Patent: Nov. 13, 2018

(54) LATERAL-EFFECT POSITION-SENSING DETECTOR

(71) Applicant: HRL Laboratories, LLC, Malibu, CA (US)

(72) Inventor: Daniel Yap, Newbury Park, CA (US)

(73) Assignee: HRL Laboratories, LLc, Malibu, CA (US)

( * ) Notice: Subject to any disclaimer, the term of this patent is extended or adjusted under 35 U.S.C. 154(b) by 66 days.

(21) Appl. No.: 15/238,572

(22) Filed: Aug. 16, 2016

(51) Int. Cl.
| | |
|---|---|
| *H01L 31/109* | (2006.01) |
| *H01L 31/18* | (2006.01) |
| *H01L 31/0304* | (2006.01) |
| *H01L 31/0352* | (2006.01) |
| *H01L 31/0232* | (2014.01) |
| *H01L 31/0236* | (2006.01) |

(52) U.S. Cl.
CPC ...... *H01L 31/109* (2013.01); *H01L 31/02327* (2013.01); *H01L 31/02366* (2013.01); *H01L 31/03046* (2013.01); *H01L 31/035272* (2013.01); *H01L 31/1844* (2013.01)

(58) Field of Classification Search
CPC ......... H01L 27/14649; H01L 31/02161; H01L 31/035236; H01L 31/03046; H01L 27/14636; H01L 31/109; H01L 27/14629; H01L 31/1868; H01L 27/1462; H01L 27/14698; H01L 27/14634; H01L 31/1013; H01L 31/101; H01L 31/09; H01L 31/00; H01L 31/02024; H01L 27/146; H01L 51/447; H01L 31/0236; H01L 51/4246; G01J 1/04; G01D 5/38; G02B 27/42; Y02E 10/549

USPC ........................................................ 257/185
See application file for complete search history.

(56) References Cited

U.S. PATENT DOCUMENTS

| | | |
|---|---|---|
| 4,679,063 A | 7/1987 | White |
| 6,815,790 B2 | 11/2004 | Bui et al. |
| 7,333,181 B1 | 2/2008 | Scott et al. |
| 7,687,871 B2 | 3/2010 | Maimon |
| 7,795,640 B2 | 9/2010 | Klipstein |

(Continued)

OTHER PUBLICATIONS

U.S. Appl. No. 13/372,366, filed Feb. 13, 2012, Yap et al.

(Continued)

*Primary Examiner* — Roy Potter
(74) *Attorney, Agent, or Firm* — Ladas & Parry

(57) ABSTRACT

A lateral-effect position-sensing detector includes a second lateral-current collector layer, an electron barrier layer on the second lateral-current collector layer, an absorber layer on the electron barrier layer, a first lateral-current collector layer on the absorber layer, and a first elongate electrical contact and a second elongate electrical contact on each of the lateral-current collector layers. Incident light radiates a transparent first lateral-current collector layer to be absorbed by the undepleted absorber layer where electron and holes are generated. The depleted electron barrier layer prevents a flow of electrons from the absorber layer to the second lateral-current collector layer but allows electrons to flow to the second lateral-current collector layer. The lateral-effect position-sensing detector is sensitive to a lateral position between the first elongate electrical contact and the second elongate electrical contact of incident light on each of the lateral-current collector layer.

32 Claims, 12 Drawing Sheets

Y-position offset from center:

$$Y = \frac{I_{Y2} - I_{Y1}}{I_{Y2} + I_{Y1}} \times \frac{L_Y}{2}$$

X-position offset from center:

$$X = \frac{I_{X2} - I_{X1}}{I_{X2} + I_{X1}} \times \frac{L_X}{2}$$

(56) References Cited

U.S. PATENT DOCUMENTS

| | | | |
|---|---|---|---|
| 7,928,389 B1 | 4/2011 | Yap et al. | |
| 9,444,001 B1 * | 9/2016 | Sharifi | H01L 31/109 |
| 9,444,011 B2 * | 9/2016 | Kozaki | B82Y 20/00 |
| 2003/0080298 A1 * | 5/2003 | Karplus | G01T 1/208 |
| | | | 250/370.1 |
| 2010/0089443 A1 * | 4/2010 | Bloomstein | H01L 51/0096 |
| | | | 136/255 |

OTHER PUBLICATIONS

J. T. Wallmark: "A new semiconductor photocell using lateral photoeffect." Proceedings of the IRE, Apr. 1957, vol. 45, S. pp. 474-483.

R. Wolfshagen, et al., "HgCdTe position sensitive detector (PSD) development," Proceedings SPIE, 2010, vol. 7660, Paper 76600H.

P. Klipstein, "XBn barrier photodetectors for high sensitivity and high operating temperature infrared sensors," Proceedings SPIE, 2008, vol. 6940, Paper 69402U.

S. Maimon and G. W. Wicks, "nBn detector, an infrared detector with reduced dark current and higher operating temperature," Applied Physics Letters 2006, vol. 89, Paper 151109.

H. Sharifi, et al., "Fabrication of high operating temperature (HOT), visible to MWIR, nCBn photon-trap detector arrays," Proceedings of SPIE, 2013, vol. 8704, Paper 87041U.

A. I. D'Souza, et al., "MWIR $InAs_{1-x}Sb_x$ nCBn Detectors Data and Analysis," Proceedings of SPIE, 2012, vol. 8353, Paper 835333.

W. Dai, D. Yap and G. Chen, "Wideband enhancement of infrared absorption in a direct band-gap semiconductor by using nonabsorptive pyramids," Optics Express, Jun. 15, 2012, vol. 20, A519-A529.

* cited by examiner

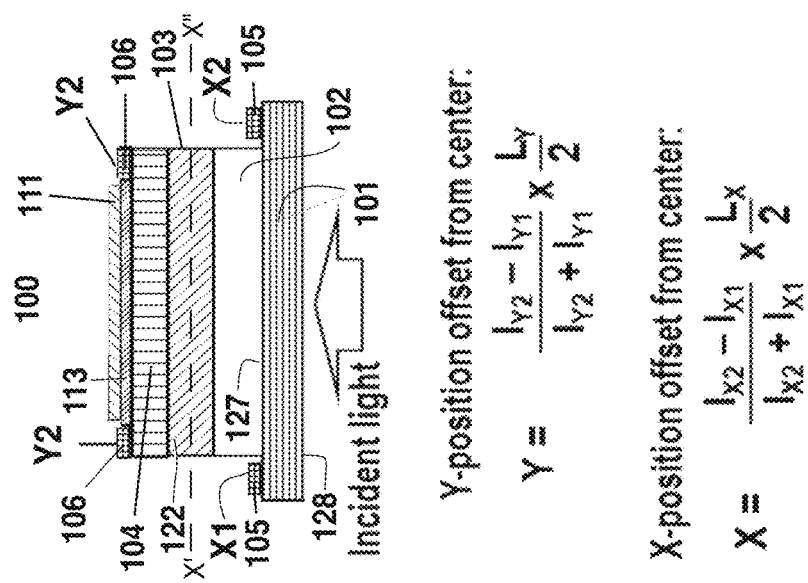
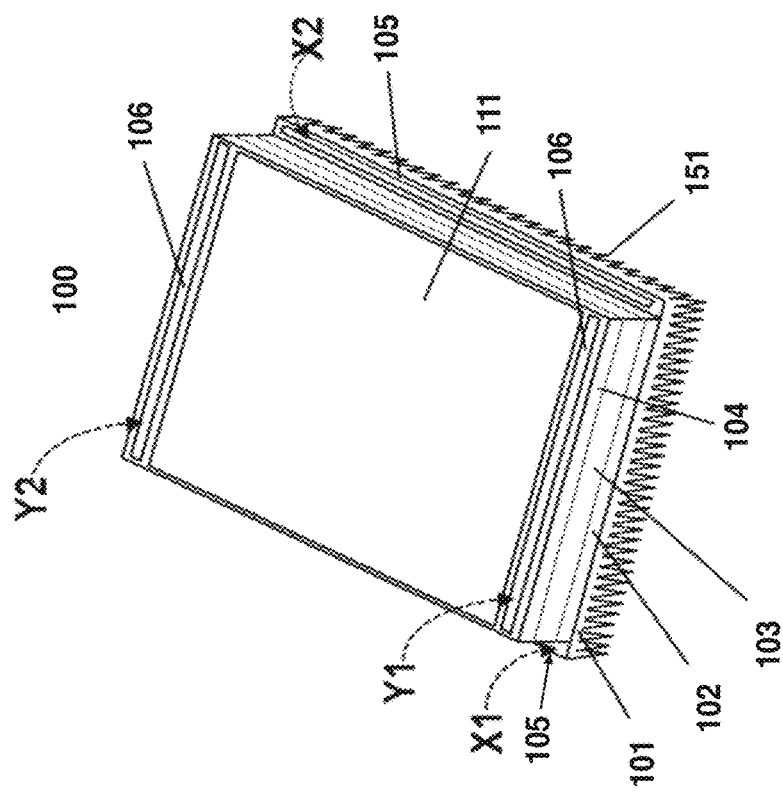
Figure 1b
Figure 1a

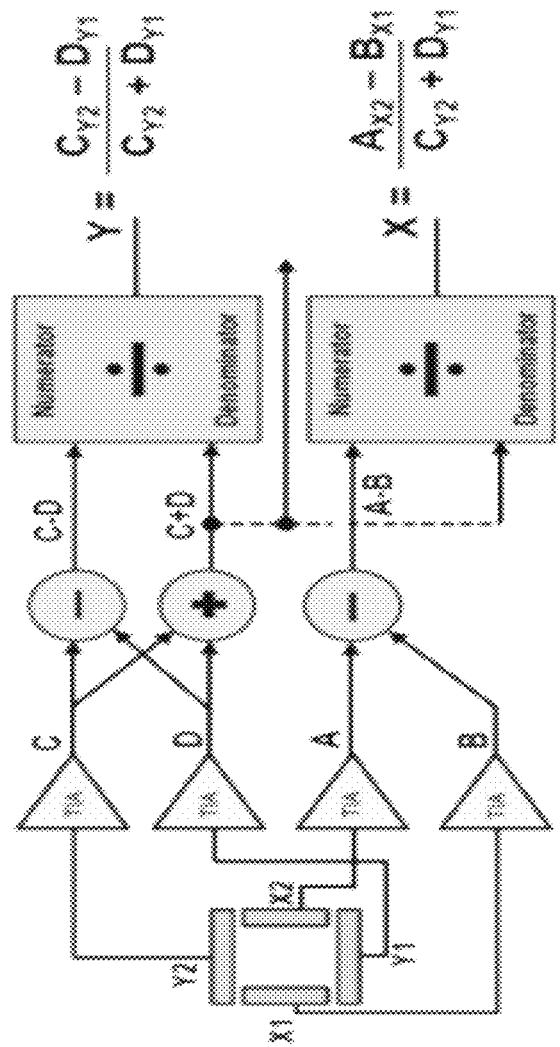
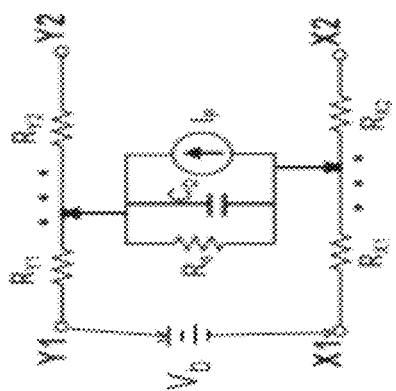
Figure 2a
Figure 2b

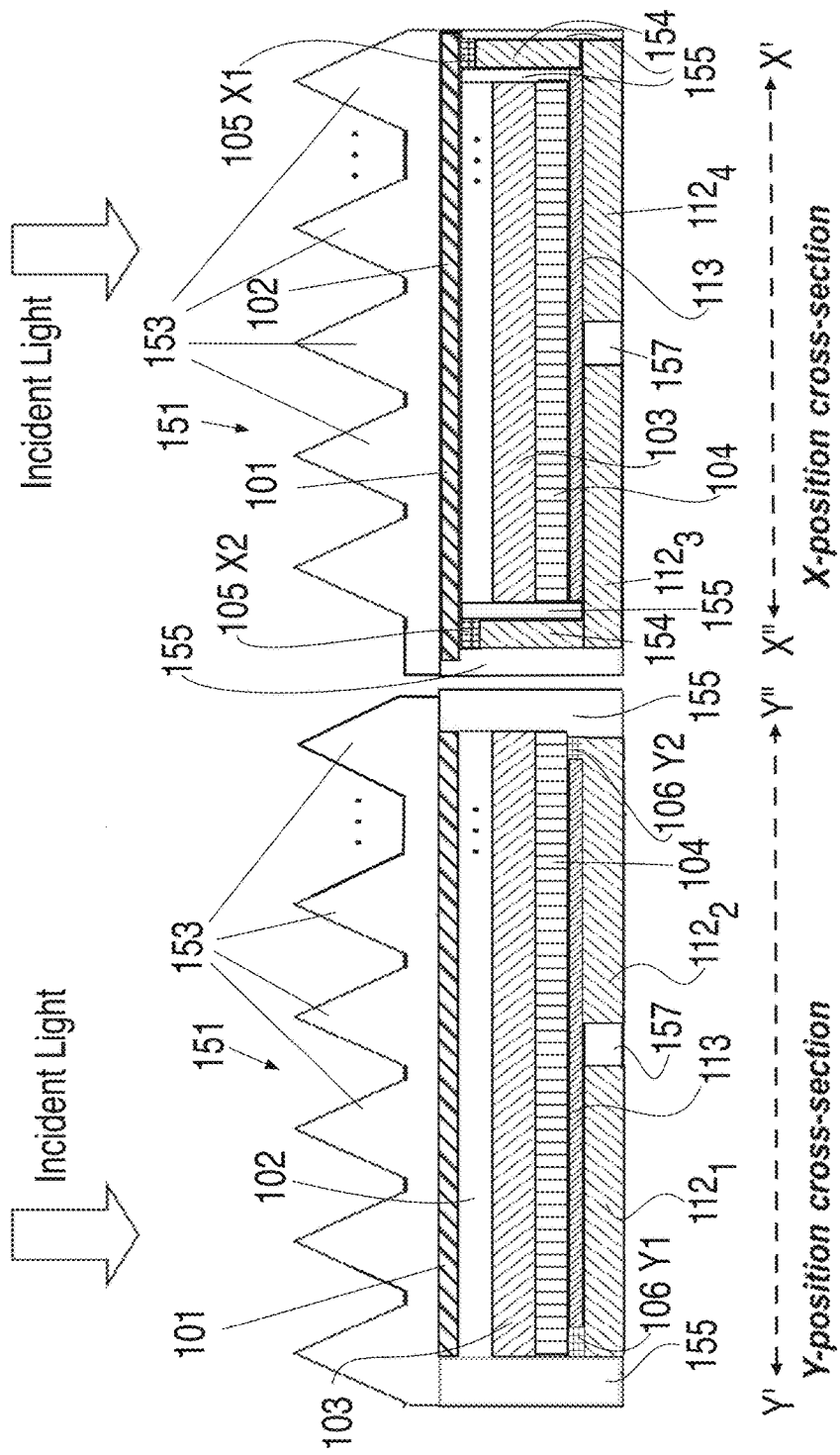

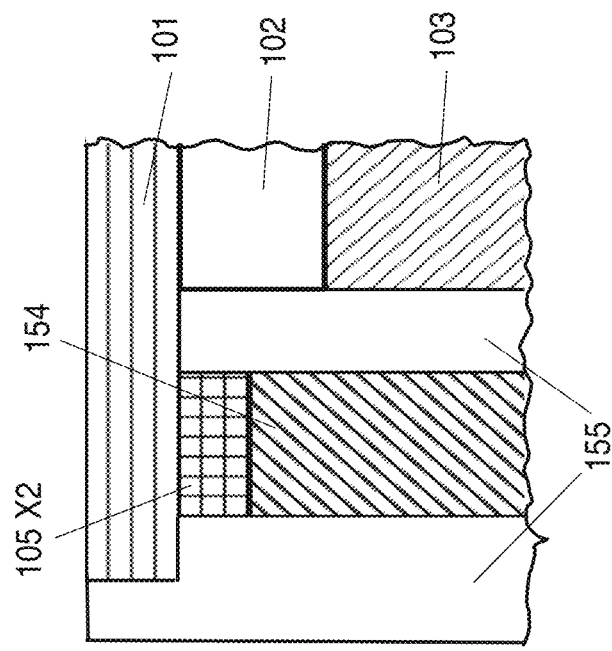
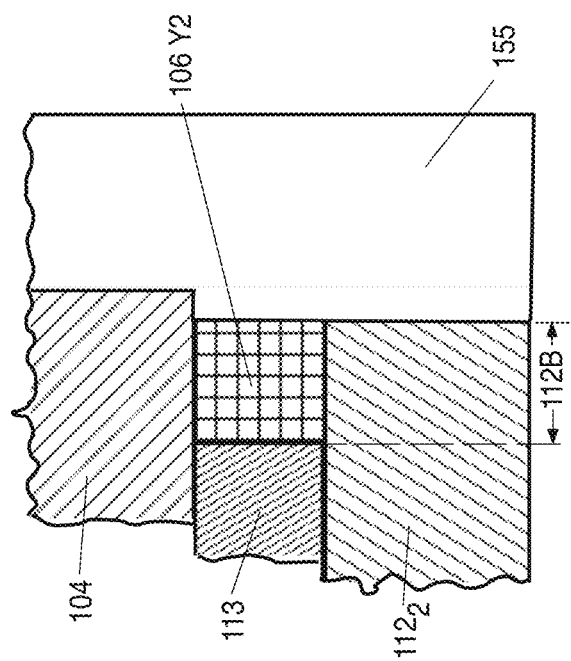
Figure 5d
Figure 5c

Wherein the $LCCL_B$, electron barrier layer, absorber layer and $LCCL_A$ form a lateral-effect position sensing detector which is sensitive to a lateral position of incident light relative to the first and second electrical contacts of each of $LCCL_A$ and $LCCL_B$ ~180

In use, determining the lateral positions of incident light, on the absorber layer, relative to the electrical contacts, by calculating x and y coordinates according to a difference between the first and second currents exiting lateral current conducting $LCCL_B$ layer and a difference between the first and second currents exiting lateral current conducting $LCCL_A$ layer. ~181

In use, determining the intensity of the incident light on the absorber layer 102 is determined by summing the first and second currents exiting the second lateral current conducting layer $LCCL_B$ or summing the first and second currents exiting the lateral current conducting layer $LCCL_A$. ~182

Figure 6c

LATERAL-EFFECT POSITION-SENSING DETECTOR

REFERENCE TO A CONTRACT

None

CROSS REFERENCE TO RELATED APPLICATIONS

None

INCORPORATION BY REFERENCE

The present disclosure relates to co-pending U.S. patent application Ser. No. 13/372,366, filed on Feb. 13, 2012 and entitled: "Wideband Detector Structures", which is hereby incorporated by reference.

TECHNICAL FIELD

The present invention relates to sensing light of short-wave infrared (SWIR) and mid-wave infrared (MWIR) wavelengths using a dual-axis, lateral-effect position-sensing detector (LEPSD) configured to reduce the generation/recombination (GR) components of dark-current noise, reduce the device capacitance and/or reduce the series resistance to the current flow to the detector electrodes. More particularly, the present invention relates to a LEPSD structure, a method for producing such LEPSD and a sensor system incorporating the LEPSDs.

BACKGROUND

A lateral-effect position-sensing detector (LEPSD) can be part of an optical angle-of-arrival sensor system that determines the incidence angle of the SWIR or MWIR light produced (typically wavelengths of light between approximately 3 µm and 5 µm), for example, by a transient event or a rapidly moving object. In these instances, SWIR or MWIR radiation arises from heat generated or chemical reactions caused by such events or moving objects.

LEPSDs have been known with respect to detection of visible light since at least 1957, such as described in J. T. Wallmark: "A new semiconductor photocell using lateral photoeffect." Proceedings of the IRE, Vol. 45, S. 474-483 (1957).

Prior art MWIR LEPSD elements assembled in arrays are described in B. H. Scott, R. Wolfshagen and J. Buck, "Methods for the use and manufacture of infrared position-sensing detector focal plane arrays for optical tracking," U.S. Pat. No. 7,333,181 B1 (2008) and R. Wolfshagen, et al., "HgCdTe position sensitive detector (PSD) development," Proceedings SPIE Vol. 7660, p. 76600H (2010). As explained in the latter reference, the LEPSD discussed therein is a quadrilateral device fabricated from HgCdTe material having a single lateral p-type current conducting layer with four contacts located on the same side of the n-type absorber layer. While the LEPSDs described in the former reference, fabricated from either InSb or HgCdTe or other IR sensitive semiconductor material, can be either the quadrilateral devices or the dual-axis devices and are said to be able to detect light of MWIR wavelengths, no dual-axis structure for such a MWIR LEPSD is disclosed or claimed.

As described in P. S. Bui and N. D. Taneja, "Position-sensing detector for the detection of light within two dimensions," U.S. Pat. No. 6,815,790 B2 (2004), is another prior art LEPSD. This LEPSD is of the dual-axis type having an InGaAs absorber, for detecting short-wave infrared (SWIR) light, sandwiched between two layers of InP. These InP layers serve as the lateral current conducting layers and the resistive dividers with each layer having a pair of contacts. The InGaAs is a direct-band gap absorber and can be fairly thin with a thickness of 2.0-3.0 µm being typical for achieving maximal absorption of the SWIR light. The LEPSD of this reference has a PIN diode structure with high capacitance due to the thin, preferably undoped or lightly doped, InGaAs I-layer between the two InP layers, one being a P-layer and the other the N-layer. The high capacitance of this LEPSD structure can limit the response bandwidth and rise time of a large-area device.

A MWIR detector having an electron barrier in its material structure is described in P. Klipstein, "XBn barrier photodetectors for high sensitivity and high operating temperature infrared sensors," Proceedings SPIE Vol. 6940, paper 69402U (2008) and P. Klipstein, "Depletion-less photodiode with suppressed dark current and method for producing the same," U.S. Pat. No. 7,795,640 B2 (2010). This prior art MWIR detector has an absorber of n-type materials that is not depleted, a depleted wide band gap, electron-blocking barrier of n-type or p-type materials adjacent to the absorber, a contact layer of n-type material and a contact layer of p-type materials. However, a LEPSD formed from this structure, while desirable for a MWIR LEPSD, would have one of its lateral-current conducting layers comprise the p-type material. The inter-electrode resistance from such a hole-conducting layer would be quite high and the depleted barrier layer of this structure, having a thickness of only 0.05-1 µm, would result in a fairly high capacitance per unit area, with a concomitant degradation of response bandwidth and rise time of a large-area device. The capacitance per unit area of the photodetector increases as the thickness of the depleted region is reduced.

Another prior art MWIR detector having an electron barrier in its material structure is described in S. Maimon and G. W. Wicks, "nBn detector, an infrared detector with reduced dark current and higher operating temperature," Applied Physics Letters, 89, 151109 (2006) and S. Maimon, "Reduced dark current photodetector," U.S. Pat. No. 7,687,871 B2 (2010). This prior art detector has an n-type absorber, an un-doped barrier adjacent the absorber and an n-type contact layer. The thicknesses of the barrier layer is typically 0.05-0.1 µm and the contact layer is 0.02-0.05 µm. This prior art detector structure has n-doped layers (the contact layer and the substrate) that could be used for the two lateral-current conducting layers of a LEPSD. However, the photo-current through one of the contact layers is carried by the minority holes which would result in high inter-electrode resistance. Also, due to a barrier thickness of only 0.05-0.1 µm, this structure cannot provide a lateral-effect PSD with sufficiently low capacitance per unit area. Moreover, the Maimon patent does not include a broken-gap hetero-junction (herein, Type III hetero-junction) between the barrier layer and the contact layer. As a result, the problem relating to response bandwidth and rise time in the prior art is exhibited in this structure as well.

In still more prior art documents, a MWIR detector array fabricated from material that contains a barrier, absorber and collector (or contact layer) is described in D. Yap, R. D. Rajavel, S. Mehta and J. S. Colburn, "Wide bandwidth infrared detector and imager," U.S. Pat. No. 7,928,389 B1 (2011), H. Sharifi, et al., "Fabrication of high operating temperature (HOT), visible to MWIR, nCBn photon-trap detector arrays," Proceedings of SPIE Vol. 8704, 87041U (2013), and A. I. D'Souza, et al., "MWIR InAs1–xSbx nCBn detectors data and analysis," Proceedings of SPIE Vol. 8353, paper 835333 (2012). For this detector array the absorber is etched into 3-dimensional pyramid-shaped structures that reduce the volume of absorber material while also trapping the incident photons in the absorber. This detector array demonstrated broadband absorption of light from below 3 µm wavelength to beyond 5 µm wavelength, at an operating temperature of 200K and reduced the dark current by approximately a factor of 3 compared to devices that were not etched. Despite its smaller absorber volume, the internal quantum efficiency of the detectors is higher than 80%. However, no LEPSD is disclosed in this prior art invention.

A prior art photodetector structure described as having an electron barrier layer that has a thickness of 3-10 µm is described in A. M. White, "Infrared detectors," U.S. Pat. No. 4,679,063 (1987). That barrier, which blocks the flow of electrons but does not block the flow of holes, comprises p-doped material that is sandwiched, in a NPN configuration, between two layers of n-type material having smaller band gap than the material of the electron barrier. Although that prior art electron barrier is wide, only a portion of that wide barrier is depleted, with another portion of that barrier being undepleted. This photodetector structure does not have any feature to achieve depletion of the entire thickness of the electron barrier layer, nor is increase in the width of that depleted region of the electron barrier discussed as being favorable. Also, the entire NPN structure of this prior photodetector is fabricated from HgCdTe or GaAlAs (common-anion) materials and thus it cannot contain any Type III hetero-junctions.

A LEPSD with faster temporal response or wider bandwidth frequency response, than is presently available from prior art LEPSDs, is desirable because it makes possible the identification of short transient events and the tracking of more rapidly moving objects. It is also desirable to have a LEPSD with larger instantaneous field of view for a given frequency-response bandwidth, which can be achieved with a LEPSD having a smaller capacitance per unit area and thus permitting a larger light-absorbing area. A novel LEPSD with reduced dark current, low inter-electrode resistance and reduced capacitance, together with a method for making the same and a sensor system incorporating the same, is presently disclosed. This is achieved by a device that has a narrow band gap absorber, a Type III alignment of the junction between the electron barrier layer and a lateral-current conducting layer of the LEPSD and with the electron barrier designed to be >2 µm thick and to be depleted over almost its entire width or thickness.

SUMMARY OF THE INVENTION

Certain embodiments disclosed herein comprise a lateral effect position sensing detector (LEPSD 100) of incident light having: a first lateral-current conducting layer ($LCCL_A$ 101) comprising one or more semiconductor materials and having a first side face 128 and a second side 127, wherein $LCCL_A$ 101 is disposed to receive the incident light on its face 128 and having two elongate electrical contacts 105 at opposing edges, and wherein the one or more semiconductor materials of the $LCCL_A$ 101 is an $n^+$-type material; an absorber layer 102 comprising one or more semiconductor materials and having a first side 126 and a second side 125, wherein the first side 126 of the absorber layer 102 is disposed on the second side 127 of $LCCL_A$ forming a hetero-junction, with an optional $p^+$-type delta doping 147 applied in the vicinity of the hetero-junction, and wherein the absorber layer 102 is an n-type semiconductor material that is un-depleted or nearly un-depleted; an electron barrier layer 103 comprising one or more semiconductor materials wherein the electron barrier layer 103 having a first side 124 and a second side 123, wherein the first side 124 of the electron barrier layer 103 is disposed adjacent to the second side 125 of the absorber layer 102 forming a hetero-junction, with an optional $n^{++}$-type delta doping 145 applied in the vicinity of the hetero-junction, and wherein the electron barrier layer 103 is a depleted, or at least 95% depleted, intrinsic semiconductor material, which can be depleted of free electrons when an optional external reverse-bias voltage is applied between one or more of the two elongate electrical contacts 105 and 106 of each of $LCCL_A$ and $LCCL_B$, respectively, and a second lateral-current conducting layer ($LCCL_B$ 104) comprising one or more semiconductor materials, wherein $LCCL_B$ 104, having a first side 122 and a second side 121, wherein the first side 122 is disposed adjacent to the second side 123 of the electron barrier layer 103, and having two elongate electrical contacts 106 at opposing edges, and wherein the one or more semiconductor materials of $LCCL_B$ 104 is an $n^+$-type material; wherein the absorber layer 102 absorbs the incident light and generates electrons and holes; and wherein the electron barrier layer 103 prevents flows of electrons from the absorber layer 102 into the electron barrier layer 103 but permits flows of holes from the absorber layer 102 into the electron barrier layer 103.

In other embodiments the electron barrier layer 103 and the adjacent $LCCL_B$ 104 of the LEPSD 100 have an interface that is a broken gap Type III hetero-junction 137, or alternatively a staggered gap Type II hetero-junction, which optionally has a p-delta doped region located in the vicinity of the Type III, or alternate Type II, hetero-junction. In lieu of the optional p-delta doped region, in a further embodiment an optional p-doped layer 141 having a first side 144 and a second side 142 is disposed between the $LCCL_B$ 104 and the electron barrier layer 103, wherein the first side 144 of the p-doped layer 141 abuts the second side 123 of the electron barrier layer 103 and the second side 142 of the p-doped layer 141 abuts the first side 122 of $LCCL_B$ 104, creating a material interface that is a Type II or Type III hetero-junction 137 (see FIGS. 3 and 4). The p-doped layer 141 is preferably a semiconductor material comprising GaSb. Preferably all of the layers of the LEPSD 100, with the exception of the absorber layer 102 and a reflector layer 111 (if used) are transparent to the light to be detected by the absorption of light (SWIR and/or MWIR) in the absorber layer 102.

In further embodiments, the one or more semiconductor materials comprising the electron barrier layer 103 having a valence band energy level; the one or more semiconductor materials comprising the absorber layer 102 having a valence band energy level; and wherein the valence band energy level of the electron barrier layer semiconductor materials is approximately equal to the valence band energy of the semiconductor materials comprising the absorber layer 102. The band gap of the first lateral-current conducting layer materials preferably is sufficiently wide that the first lateral-current conducting layer does not absorb the incident light and the conduction band energy level of $LCCL_B$ 104 is close to the valence band energy level of the absorber layer 102. Preferably, the band gaps of the semiconductor materials comprising $LCCL_A$ 101 and $LCCL_B$ 104 are sufficiently large to cause $LCCL_A$ 101 and $LCCL_B$ 104 to be substantially transparent to the incident light. The LEPSD 100 is preferably sensitive to mid-wave infrared wavelengths.

In yet other embodiments, the absorber layer 102 comprises materials being at least one member of the group consisting of InAsSb or InAs, the electron barrier layer 103 comprises materials being at least one member of the group consisting of GaInSb, AlAsSb, AlInAsSb, GaSb, GaAlSb or GaAlAsSb, $LCCL_A$ 101 comprises materials being at least one member of the group consisting of InAs, InAsSb or InAlAsSb, and $LCCL_B$ 104 comprises materials being at least one member of the group consisting of InAs, InAlAsSb or InAsSb.

In some embodiments, the absorber layer 102 has a thickness in a range from approximately 2 micrometers to 5 micrometers; and the electron barrier layer 103 has a thickness greater than 1.5 micrometers, preferably in a range from approximately 1.5 micrometers to 5 micrometers, and in other embodiments greater than 5 micrometers.

In further embodiments, the electron barrier layer 103 comprises a first sub-layer 131 and a second sub-layer 133, wherein the first sub-layer 131 forms a hetero-junction with the absorber layer 102, wherein the second sub-layer 133 forms a broken-gap Type III hetero-junction 137 with $LCCL_B$ 104, wherein the semiconductor materials of both the first sub-layer 131 and the second sub-layer 133 have a conduction band energy level that is higher than a conduction band energy level of the one or more semiconductor materials comprising the absorber layer 102 and is higher than the conduction band energy level of the one or more materials comprising the $LCCL_B$ 104, and wherein the valence band energy levels of the materials of both the first sub-layer 131 and the second sub-layer 133 are equal to or greater than the valence band energy level of the one or more materials of the absorber layer 102.

In other embodiments, with respect to FIG. 1e, the one or more semiconductor materials of the electron barrier layer 103 is a graded composition, wherein a band gap of the one or more semiconductor materials comprising the barrier layer 103 is largest in a portion of the electron barrier layer 103 located nearest to the first side 124 of the electron barrier layer 103 and the band gap of the one or more semiconductor materials comprising the electron barrier layer 103 is smallest in a portion of the electron barrier layer 103 located nearest to the second side 123 of the electron barrier layer 103, wherein the portion of the electron barrier layer 103 located nearest to the first side 124 of the electron barrier layer 103 forms a hetero-junction with the second side 125 of the absorber layer 102, wherein the portion of the electron barrier layer 103 located nearest to the second side 123 of the electron barrier layer 103 forms a broken-gap Type III hetero-junction 137 with the first side 122 of $LCCL_B$ 104.

Preferably, the semiconductor materials in the graded composition electron barrier layer 103 have an electric potential gradient established in the conduction band of the electron barrier layer 103 to direct electrons to flow away from the absorber layer 102 and toward $LCCL_B$ 104, and an electric potential gradient established in the valence band of the electron barrier layer 103 to direct holes to flow away from the absorber layer 102 and toward $LCCL_B$ 104.

In some embodiments, the semiconductor materials in the graded composition electron barrier layer 103 at the portion of the electron barrier layer 103 located nearest to the first side 124 of the electron barrier layer 103 is comprised of $Ga_wAl_xAs_ySb_z$. Typically, the fractions w, x and y add to a value of 1.0 and z=1. The semiconductor materials in the graded composition electron barrier layer 103, at approximately half way between the first side 124 of the electron barrier layer 103 and the second side 123 of the electron barrier layer 103, is comprised of $Ga_{w+d}Al_{x+e}As_{y+f}Sb_z$, wherein compositions of GaAlAsSb, having incrementally changing mole fractions in a range between $Ga_wAl_xAs_ySb_z$ and $Ga_{w+d}Al_{x+e}As_{y+f}Sb_z$, are disposed between the portion of the electron barrier layer 103 located nearest to the first side 124 of the electron barrier layer 103 and approximately half way between the first side 124 of the electron barrier layer 103 and the second side 123 of the electron barrier layer 103.

Typically, as the mole fractions change as referenced, the fractions w, x and y are incrementally adjusted by fractions d, e and f, respectively, which resulting adjusted factions add to a value of 1.0. Subscript z remains equal to 1. As is known by those skilled in the art of semiconductor fabrication, each individual fraction d, e and f will necessarily be positive or negative in order to keep the resulting adjusted fractions equal to 1. The values of fractions d, e and f are selected in order that, while there be no energy discontinuity in the valence band, $E_v$, and thus no barrier to the free flow of carrier holes from the absorber layer 102 to the electron barrier layer 103. However, an intentionally large conduction band energy discontinuity in the electron barrier is introduced at the junction between the absorber layer 102 and the electron barrier layer 103, which is much larger than the conduction band energy in the absorber layer 103. This discontinuity blocks the flow of the carrier electrons. Within the electron barrier layer 103, as the distance increases away from the first side 124 of the electron barrier layer 103, there is a gradual increase in the valance band energy. The change in the mole fractions of the GaAlAsSb composition is selected such that the valence band energy is gradually increased as the distance away the first side 124 of the electron barrier layer 103 and from absorber layer 102 increases.

The semiconductor materials in the graded composition electron barrier layer 103 at the portion of the electron barrier layer 103 located nearest to the $LCCL_B$ 204 is comprised of $Ga_sSb_t$. The semiconductor materials in the graded composition electron barrier layer 103 at the portion of the electron barrier layer 103 located at approximately half way between the first side 124 of the electron barrier layer 103 and the second side 123 of the electron barrier layer 103, and adjacent to the location where the composition of the GaAlAsSb electron barrier layer 103 is $Ga_{w+d}Al_{x+e}As_{y+f}Sb_z$, is comprised of $Ga_{s+m}Sb_{t+n}$. The compositions of GaSb in the electron barrier layer 103, having incrementally changing mole fractions in a range between $Ga_{s+m}Sb_{t+n}$, and $Ga_sSb_t$ are disposed on the $Ga_{w+d}Al_{x+e}As_{y+f}Sb_z$ material of the electron barrier layer 103 between a point of the electron barrier layer 103 located nearest to approximately half way between the first side 124 of the electron barrier layer 103 and the second side 123 of the electron barrier layer 103. Within the electron barrier layer 103, the gradual increase in the valance band energy that began at the first side 124 of the electron barrier layer continues as the material composition of the electron barrier layer 103 changes from GaAlAsSb to GaSb at approximately half way between the first side 124 of the electron barrier layer 103 and the second side 123 of the electron barrier layer 103. The change in the mole fractions of the GaSb composition of the electron barrier layer 103 is selected such that the valence band energy is gradually increased as the distance from the absorber layer 102 increases. The mole fractions composition of the $Ga_sSB_t$ at the second side 123 of the electron barrier layer 103 is chosen such that the valance band energy level is greater than or equal to the valance band energy level of the $LCCL_B$, thus creating a Type III heterojunction 137.

In still other embodiments, the two elongate electrical contacts 105 of the first lateral-current conducting layer and the two elongate electrical contacts 106 of the second lateral-current conducting layer are Ohmic contacts, preferably comprised of gold.

Certain embodiments of the invention further comprise a metal reflector 111 and an oxide spacer 113, wherein the oxide spacer 113 has a first side 134 and a second side 135, that is formed on the face 121 of $LCCL_B$ 104 and is located between $LCCL_B$ 104 and the metal reflector 111, wherein the metal reflector 111 is disposed on the second side 135 of the oxide spacer 113 and is electrically isolated from the remainder of the LEPSD 100. Preferably, the metal reflector 111 serves as an optical reflector to reflect the incident light, not absorbed after a first pass through the lateral effect position-sensing detector, back for a second pass through the LEPSD 100. In embodiments of the invention, the thickness of the oxide spacer 113 ranges from approximately 0.1 to approximately 1 micrometers and is preferably greater than 0.3 µm. In still other embodiments, the metal reflector 111 is comprised of four triangular reflector plates $112_1$-$112_4$, wherein the triangular reflector plates $112_1$-$112_4$ are physically and electrically separated from each other by other oxide spacers 115. In yet other embodiments, metal posts 154 are disposed between the $LCCL_A$ 101 and the metal reflector 111 and are located at two opposing edges of the LEPSD 100 and are in electrical contact with at least two of the triangular reflector plates 112 and with the two elongate electrical contacts 105 of the $LCCL_A$ 101, wherein the four triangular reflector plates $112_1$-$112_4$ act as metal bonding pads.

In yet other embodiments, the structure of the LEPSD 100 includes one or more pyramid shaped elements 153, wherein the pyramid shaped elements 153 have an apex and a base, wherein the apex is positioned to be closest to the incident light, and wherein the optical refractive index of the one or more materials comprising the pyramid shaped elements is approximately equal to or less than the refractive index of the one or more materials in the absorber layer 102. Preferably, the bases of the one or more pyramid shaped elements abut the face 121 of $LCCL_B$ 104. Alternatively, the one or more pyramid shaped elements are positioned adjacent to $LCCL_B$ on the side of $LCCL_B$ 104 closest the absorber layer 102.

In other embodiments, the materials of the lateral effect position-sensing detector are disposed on a substrate, wherein the substrate comprises materials being at least one member of the group preferably consisting of GaSb and GaAs although other materials such as InAs may some times be utilized instead. The substrate may be simply removed at some convenient point during the fabrication of the device or, if transparent to the SWIR and/or MWIR light of interest, allowed to remain in the completed device.

In one embodiment, and perhaps the easiest embodiment to conceptualize, is to form $LCCL_A$ 101 on a substrate 107 and then later utilize that substrate as the material from which the optional pyramids 151 are formed. See FIGS. 1e, 5a and 5b. In other embodiments, the substrate be used to support other layers during fabrication and then either simply removed or, if transparent to the SWIR and/or MWIR light of interest, allowed to remain in the completed device.

For example, in another embodiment, a method of fabricating the invention comprises providing a substrate (similar to substrate 107), forming an second lateral-current conducting layer $LCCL_B$ 104 on the substrate and having at least two elongate electrical contacts 106, forming an electron barrier layer 103 on $LCCL_B$ 104, forming an absorber layer 102 on the electron barrier layer 103, wherein the absorber layer 102 absorbs the incident light and generates electrons and holes, and forming $LCCL_A$ 101 having at least two elongate electrical contacts 105 on the absorber layer 102; wherein the electron barrier layer 103 prevents a flow of electrons from the absorber layer 102 to $LCCL_B$ 104 and permits the flow of electrons from the absorber layer 102 through the electron barrier layer 103 to $LCCL_B$ 104. The LEPSD 100 is fabricated to be preferably sensitive to mid-wave infrared wavelengths of the incident light.

In some embodiments, the $LCCL_A$ 101 and $LCCL_B$ 104 may comprise $n^+$ doped materials, the absorber layer 102 comprising an n-type materials, the electron barrier layer 103 comprising an intrinsic, and preferably an undoped layer, so that the electron barrier 103 can be depleted of free carriers by the application of a reasonably small voltage across that layer, with the substrate preferably being at least one member of the group consisting of GaSb and GaAs.

The method preferably includes fabricating the LEPSD 100 wherein a lateral position X of the incident light is determined by calculating $X=((I_{X2}-I_{X1})/(I_{X2}+I_{X1}))*0.5L_X$ and a lateral position Y of the incident light is determined by calculating $Y=((I_{Y2}-I_{Y1})/(I_{Y2}+I_{Y1}))*0.5L_Y$; wherein the first and second elongate electrical contacts 105 of the $LCCL_A$ 101 are located on an x axis at first and second edges of the $LCCL_A$ 101 and identified as X1, X2, respectively, and the first and second elongate electrical contacts 106 of $LCCL_B$ 104 are located on a y axis at first and second edges of $LCCL_B$ 104 and identified as Y1 and Y2, respectively; wherein $L_X$ is a distance between the first and second elongate electrical contacts 105 of $LCCL_A$ 101 measured on the x axis and $L_Y$ is a distance between the first and second elongate electrical contacts 106 of $LCCL_B$ 104 measured on the y axis; wherein $I_{X1}$ is a current measured at X1 and $I_{X2}$ is a current at measured at X2 and $I_{Y1}$ is a current measured at Y1 and $I_{Y2}$ is a current at measured at Y2.

The method also preferably comprises forming an electron barrier layer 103 having a first sub-layer 131 of GaAlAsSb material, that is approximately lattice matched to the absorber layer material and forms a hetero-junction with the absorber layer 102, and comprising a second sub-layer 133 comprising of GaSb material chosen to create a Type III hetero-junction 137 with $LCCL_B$; wherein the composition of the first sub-layer material 131 at the hetero-junction between the electron barrier layer 103 and the absorber layer 102 having approximately the same valence band energy as the semiconductor material of the absorber layer 102 and a much higher, preferably more than twice, conduction band energy as the semiconductor material of the absorber layer 102, and the second sub-layer 133 having a smaller band gap than the first sub-layer and comprising semiconductor material approximately lattice matched to the first sub-layer layer material 131. In other embodiments, the method further comprises applying $n^{++}$-type delta doping 145 at the hetero-junction between the absorber layer 102 and first sub-layer of the electron barrier layer 103. Alternatively, the second sub-layer of the electron barrier layer 103 comprises a composition of GaAlAsSb material.

In some embodiments the method further preferably comprises forming one or more pyramid shaped elements 153 on $LCCL_A$ 101, wherein the pyramid shaped elements 153 have an apex and a base, and positioning the apex closest to the incident light, wherein the optical refractive index of the one or more materials comprising the pyramid shaped elements 153 is approximately equal to or less than the refractive index of the one or more materials in the absorber layer 102, the electron barrier layer 103 and $LCCL_A$ 101 and $LCCL_B$ 104.

In yet other embodiments the method preferably includes forming a metal reflector 111 on the substrate, forming an oxide spacer 113 on the metal reflector 111 with a thickness greater than 0.3 μm, forming the second lateral-current conducting layer on the oxide spacer 113; wherein the first side 134 of the oxide spacer 113 abuts the face 121 of $LCCL_B$ 104 and the second side 135 abuts the first side 132 of the metal reflector 111 and the metal reflector 111 is electrically isolated from the remainder of the LEPSD 100 by the oxide spacer 113 except where is serves as contacts in regions 112B (see FIG. 1d) for the LEPSD 100. The metal reflector 111 is preferably formed as four triangular reflector plates $112_1$-$112_4$, wherein the triangular reflector plates $112_1$-$112_4$ are separated from each other by oxide spacers, and alternatively act as metal bonding pads. Two metal posts 154 are preferably formed between the two elongate electrical contacts 105 of $LCCL_A$ 101 and two of the triangular reflector plates 112, and at two opposing edges of the LEPSD 100, so that the metal posts 154 are in electrical contact with two of the triangular reflector plates (plates $112_3$ and $112_4$) and with the two elongate electrical contacts 105 of $LCCL_A$ 101.

In one embodiment of the invention, a sensor comprises a LEPSD 100 of incident light, having a preferably characteristic optical absorption responses within a mid-wave infrared band of wavelengths, and four transimpedance amplifiers, having characteristic frequency response bandwidths that are smaller than characteristic frequency response bandwidths of the corresponding LEPSD 100, wherein the LEPSD 100 has a $LCCL_A$ 101 having two elongate electrical contacts 105, X1 and X2, a $LCCL_B$ 104 having two elongate electrical contacts 106, Y1 and Y2, an absorber layer 102, and an electron barrier layer 103; wherein the absorber layer 102 absorbs the incident light and generates electrons and holes, and the electron barrier layer 103 prevents the flow of electrons from the absorber layer 102 into the electron barrier layer 103 but permits the flow of holes from the absorber layer 102 into the electron barrier layer 103, and wherein the electrons prevented from flowing from the absorber layer 102 and the holes permitted to flow into the electron barrier layer 103 create an output current, $I_{X1}$, $I_{X2}$, $I_{Y1}$ and $I_{Y2}$, at each of the four elongate electrical contacts 105 and 106, and wherein each of the elongate electrical contacts 105 and 106 are electrically connected to a transimpedance amplifier, and wherein the four output currents result in currents A, B, C and D at the outputs of the four transimpedance amplifiers, and a lateral position X of the incident light is determined by calculating $X=(A-B)/(C+D)$, and a lateral position Y of the incident light by calculating $Y=(C-D)/(C+D)$.

In still another embodiment of the invention, the lateral effect position-sensing detectors of the sensor further comprises having a depletion region depleted of free carriers and coinciding with the electron barrier layer 103, wherein the electron barrier layer 103 has a width that is at least 1.5 μm and comprises semiconductor material whose residual carrier concentration is lower than $2 \times 10^{16}$ cm$^{-3}$. In further embodiments, the lateral effect position-sensing detector has a characteristic capacitance per unit area that is smaller than 100 picoFarads per mm$^2$ and preferably smaller than 50 picoFarads per mm$^2$. In yet further embodiments, the electron barrier layer 103 and the first and second lateral-current conducting layers have minimal or no absorption of light. In still further embodiments, the lateral effect position-sensing detector detects wavelengths within a mid-wave infrared band of wavelengths.

For still more descriptions of embodiments of the invention, please see the appended claims.

BRIEF DESCRIPTION OF THE DRAWINGS

FIG. 1a illustrates a perspective view of an embodiment of the present invention having a wide electron barrier layer relative to the absorber layer sandwiched between two lateral-current conducting layers for position-sensing.

FIG. 1b illustrates an elevation view of an embodiment of the present invention depicting its operation to determine position of the incident light on the detector.

FIG. 2a illustrates an equivalent circuit of the present invention.

FIG. 2b illustrates electronic interface circuit for position determination of the present invention.

FIG. 5a illustrates a cross sectional view of another embodiment of the present invention along the Y axis and showing pyramid shaped elements for capturing the incident light.

FIG. 5b illustrates a cross sectional view of another embodiment of the present invention along the X axis and showing pyramid shaped elements for capturing the incident light.

FIG. 5c illustrates a partial cross sectional and expanded view of that portion of FIG. 5a including elongate electrical contact Y2.

FIG. 5d illustrates a partial cross sectional and expanded view of that portion of FIG. 5b including elongate electrical contact X2.

FIGS. 6a and 6b form a method map for making the Lateral-Effect Position-sensing Detector of the present invention while FIG. 6c depicts steps which may be followed in utilizing the Lateral-Effect Position-sensing Detector of the present invention.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1C:
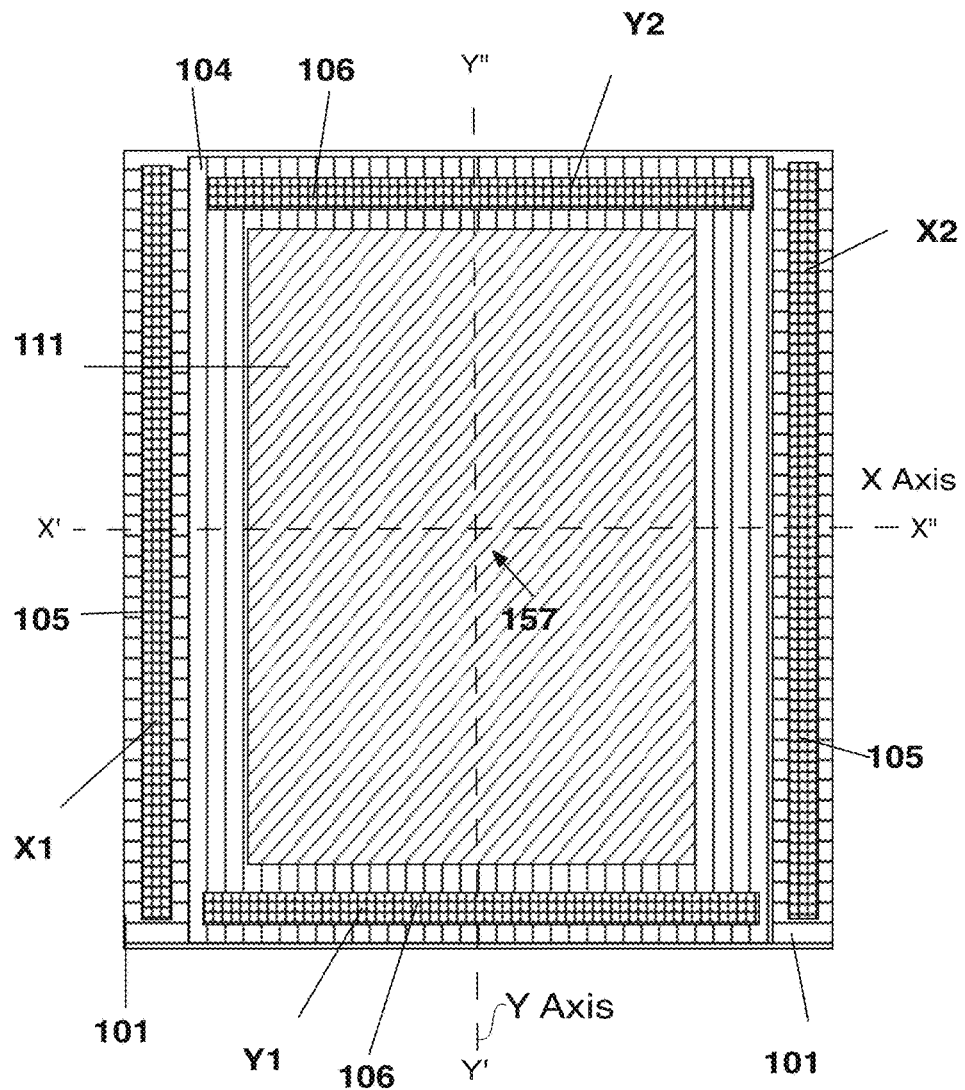
FIG. 1c illustrates a plan view of an embodiment of the present invention having two elongate electrical contacts disposed on each of the two lateral-current conducting layers.

FIGS. 1a, 1b and 1c show an embodiment of a dual axis lateral-effect position-sensing detector (LEPSD 100) for incident light of short-wave infrared (SWIR) wavelengths (typically wavelengths of light at or between 2 µm and 3 µm) and/or mid-wave infrared (MWIR) wavelengths (typically wavelengths of light at or between 3 µm and 5 µm). Preferably all of the layers of the LEPSD 100, with the exception of the absorber layer 102 and a reflector layer 111 (if used) are transparent to the light to be detected by the absorption of light (SWIR and/or MWIR) in the absorber layer 102. So with appropriate selections of materials, the LEPSD 100 can be useful for the detection of light in either the SWIR and/or MWIR and possibly other wavelength regimes.

This detector 100 has two lateral-current conducting layers, $LCCL_A$ 101 and $LCCL_B$ 104, with each lateral-current conducting layer having a pair of elongate electrical contacts 105 and 106, respectively, shown in FIGS. 1a-1c as elongate strips of contact metal X1 and X2 (which are associated with and couple to lateral-current conducting layer $LCCL_A$ 101) and Y1 and Y2 (which are associated with and couple to lateral-current conducting layer $LCCL_B$ 104). These pairs of elongate electrical contacts 105 and 106, respectively, are preferably located at or near opposite edges of that lateral-current conducting layer with which they are associated.

In the following embodiments, the LEPSD 100 is preferably aligned with a pair of virtual orthogonal x and y axes (Cartesian coordinates) whose origin is preferably located at the center 157 of the LEPSD 100 as shown in FIG. 1c. FIG. 1e identifies the various layers that comprise embodiments of the LESPD 100 (so in FIG. 1e more layers may be shown than are used in certain embodiments described in greater detail below).

The two elongate electrical contacts 105 to $LCCL_A$ 101 are labeled X2 and X1 and the two elongate electrical contacts 106 to $LCCL_B$ 104 are labeled Y1 and Y2. The electrical contacts 105 and 106 are preferably elongate and extend nearly from one corner to another corner of two opposing edges on the faces, 128 and 121, of the LCCLs. $LCCL_A$ 101 and $LCCL_B$ 104 are preferably transparent to the incident SWIR or MWIR light. A first side face 128 of the $LCCL_A$ 101 preferably faces the incident SWIR or MWIR light and a second side 127 of the $LCCL_A$ 101 abuts the immediately adjacent absorber layer 102 that absorbs the incident SWIR or MWIR light to be detected by the LEPSD 100, creating at least one electron and at least one hole for each photon that is absorbed. A first side 122 of $LCCL_B$ 104 preferably abuts the second side 123 of the immediately adjacent electron barrier layer 103 (unless there is an intervening layer 141) which layer 103 is transparent to the SWIR or MWIR light. The $LCCL_B$ 104 preferably has a thickness of 1.5 µm to 5 µm. A second side face 121 of the $LCCL_B$ 104 opposes the first side 122 of $LCCL_B$ 104.

In this embodiment of the LEPSD 100 the incident light strikes the first side face 128 of $LCCL_A$ 101 and the LEPSD 100 has an optional metal reflector 111 disposed on the second side face 121 of $LCCL_B$ 104. If the LEPSD 100 is fabricated without the optional reflector 111, the LEPSD 100 can detect incident light striking the face 128 or 121 of either $LCCL_A$ 101 or $LCCL_B$ 104, respectively.

Figure 1D:
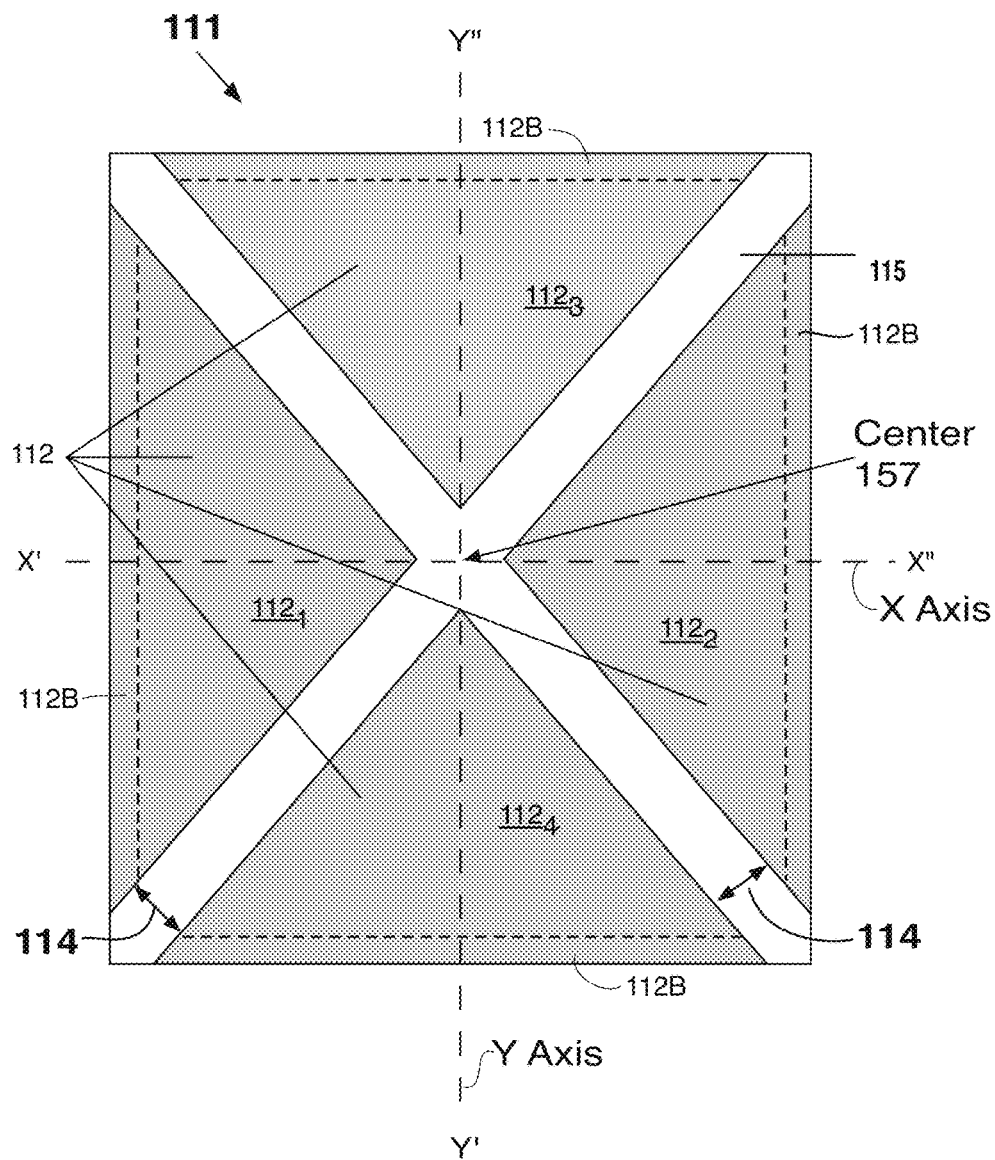
FIG. 1d illustrates a plan view of the metal reflector constructed of four triangular reflector plates.
Figure 1E:
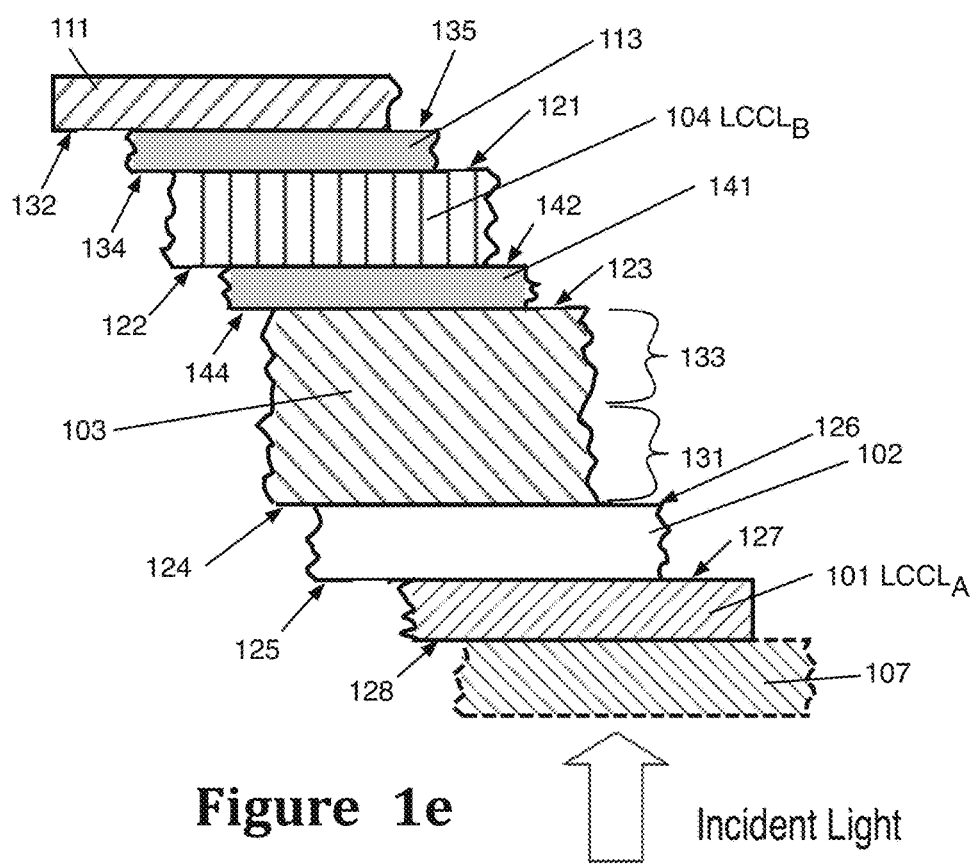
FIG. 1e illustrates partial elevation view of the present invention depicting the layers comprising the Lateral-Effect Position-Sensing Detector and the respective first and second sides of each of the layers.

The metal reflector 111, if utilized, is preferably formed as four triangular reflector plates 112 as depicted in FIG. 1d. These plates are sometimes referred to with a subscript (as in $112_1$-$112_4$) when a particular plate in being referred to herein. FIG. 1d is not drawn to scale in order to depict the separation 114 between the four reflector plates 112 more clearly. The apexes of each triangle, shown as isosceles triangles, should be formed as close to the center 157 of the metal reflector 111 as reasonably possible without touching and the ends of each base 112B of the isosceles triangles should be formed as close to the nearest ends of the bases of each of the two flanking triangles, so that separation spacing 114 is preferably as small is reasonably possible. When forming the four triangular reflector plates 112, the area 114 separating the four reflector plates 112 may be filled with an oxide spacer 115 or dielectric material to create a non-conducting spacer 115 between the plates to create electrical isolation between the four reflector plates 112. The triangular reflector plates 112 do not have to be isosceles triangles or even symmetrical. The reflector plates 112 may be other triangular or geometric configurations preferably covering as much of the $LCCL_B$ as possible if a metal reflector 111 is utilized.

In some embodiments, both of $LCCL_A$ 101 and $LCCL_B$ 104, also are transparent to the SWIR or MWIR light to be detected by the LEPSD 100. In some embodiments, the SWIR or MWIR light to be detected is incident first upon the first side face 128 of the $LCCL_A$ 101 and then traverses, in succession, the absorber layer 102, and any unabsorbed light then traverses the electron barrier layer 103 and the $LCCL_B$ 104. In other embodiments, and preferably those without the optional metal reflector 111, the SWIR or MWIR light to be detected is incident first upon the second side face 121 of the $LCCL_B$ 104 and then traverses, in succession, the electron barrier layer 103, the absorber layer 102 and any unabsorbed light then traverses the $LCCL_A$ 101.

Embodiments of the LEPSD 100 may also have an optional structure 151 comprising pyramid shaped elements, located on the first side face 128 of the $LCCL_A$ 101, as is shown in FIG. 1a. This pyramidal structure 151 comprises material that is preferably transparent to the incident SWIR or MWIR light. The pyramidal structure 151 preferably has a set of pyramid shapes whose pointed tips face the incident light and whose bases abut the face 128 of the $LCCL_A$ 101. The height of such pyramids, if used, should preferably be fifty percent or more of the thickness of the absorber layer 102. In some embodiments, there also may be provided a slab layer of the same material as used for the pyramidal structure 151 which slab layer is located between the base of the pyramidal structure 151 and the face 128 of the $LCCL_A$ 101. In still other embodiments, a second pyramid structure comprising pyramid shapes may be preferably located between the bases of the first pyramid structure and the first side face 128 of the $LCCL_A$ 101. The pyramids, and method of fabricating the same, are discussed in U.S. Pat. No. 7,928,389, for "Wide Bandwidth Infrared Detector and Imager" by Daniel Yap, Rajesh D. Rajaval, Sarabjit Mehta and Joseph Colburn, which is incorporated herein by reference in its entirety.

In embodiments without the optional metal reflector 111, the LEPSD 100 may have the optional referenced pyramidal structures preferably abutting the second side face 121 of the $LCCL_B$ 104 whose tips face outward, opposing the face 121 of $LCCL_B$ 104, and toward the incident light that would arrive from a direction that would first strike the tips of the pyramid structure (not shown in FIG. 1b).

An embodiment of the LEPSD 100 may also have an optional, preferably metal, reflector 111 located on the side of the LEPSD 100 opposite the side first encountered by the incident light. In FIG. 5, the metal reflector 111 preferably consists of four triangular reflector plates 112 as is shown in FIG. 1d.

In FIG. 5, an optional oxide spacer 113 is shown preferably abutting the metal reflector 111 and located between the metal reflector 111 and the $LCCL_B$ 104. In embodiments including a metal reflector 111, after the incident SWIR or MWIR traverses the LEPSD 100 from $LCCL_A$ 101, through the absorber layer 102, the electron barrier layer 103, $LCCL_B$ 104 and the oxide spacer 113, any remaining SWIR or MWIR light that was not absorbed by the absorber layer 102 during the first pass through the LEPSD 100 will impact the metal reflector 111 and preferably reflect back through the LEPSD 100. The reflected SWIR or MWIR light will traverse the oxide spacer 113, the $LCCL_B$ 104, the electron barrier layer 103 and the absorber layer 102 where preferably more of the SWIR or MWIR light will be absorbed to create a photovoltaic current as a result of the holes and electrons created by the absorption of the SWIR or MWIR light.

FIG. 1b shows a cross-sectional view of an embodiment of the LEPSD 100, as viewed from the centerline drawn along the y-axis depicted in FIG. 1c and viewed from the Y1 elongated electrical contact 106 toward the Y2 elongated electrical contact 106. In the FIG. 1b view, the elongate electrical contact 106 Y2 can be seen exposed behind the metal reflector 111. However, FIGS. 1b and 1c are not drawn to scale in order to depict the elongate electrical contact 106 Y2 in FIG. 1b. The metal reflector 111 would preferably cover as much of $LCCL_B$ 104 as possible. See, for example, FIG. 1a.

FIGS. 1b and 1e depict an embodiment of the operation of the LEPSD 100. In typical operation of this embodiment, a spatially non-uniform intensity distribution of light is incident upon the first side face 128 of the $LCCL_A$ 101. This intensity distribution may resemble a focused or nearly focused spot of light, whose size is preferably much smaller than the size of the LEPSD 100. When the incident light is absorbed in the absorber layer 102, each photon of incident light can produce at least one electron and at least one hole. The hole can pass through the electron barrier layer 103 and into the $LCCL_B$ 104. The electron, however, is blocked by the electron barrier layer 103 and, instead, may diffuse into the $LCCL_A$ 101. In another embodiment of the LEPSD 100, one fabricated without a metal reflector 111, the relevant intensity distribution of light is incident upon the second side face 121 of the $LCCL_B$ 104. The incident light passes through the $LCCL_B$ and the electron barrier layer 103 and is absorbed in the absorber layer 102. Each photon of incident light can produce at least one electron and hole. The electron is blocked from diffusing back through the electron barrier layer 103. However, the hole can pass into the $LCCL_B$ 104.

When light is incident upon a preferred embodiment of the LEPSD 100, photo-currents occur at the four elongate electrical contacts 105 and 106—X1, X2, Y1 and Y2—which are the electrical outputs of the LEPSD 100. The four output currents—$I_{X1}$, $I_{X2}$, $I_{Y1}$ and $I_{Y2}$—are derived from the photo-current $I_P$ resulting from absorption of the incident light and generation of electrons and holes.

As shown in FIG. 1c, elongate electrical contacts 105 X1 and X2 in a preferred embodiment of the LEPSD 100 are configured to determine the offset or relative displacement of the spot of incident light (or the centroid of the illumination pattern) from the center 157 of the LEPSD 100 along the x-axis. Elongate electrical contacts 106 Y1 and Y2 are preferably configured to determine the offset or relative displacement of the spot of incident light (or the centroid of the illumination pattern) from the center 157 of the LEPSD 100 along the y-axis.

The position of the illuminated spot is determined by processing the four output currents as indicated by the expressions shown in FIG. 1b, with $L_X$ and $L_Y$ being the nominal widths of the LEPSD 100 (i.e., the distances between the oppositely located elongate electrical contacts 105 and 106) along the x-axis and along the y-axis, respectively. If the illuminated spot is located at the center 157 of the LEPSD 100, values of zero are produced for the y-position offset and for the x-position offset. In another example, if the illuminated spot is located adjacent the elongate electrical contact 106 Y2, the y-position offset would have a value of $+0.5L_Y$. And, if the illuminated spot is located adjacent the elongate electrical contact 106 Y1, the y-position offset would have a value of $-0.5L_Y$.

In an embodiment of the invention, absorption of a small spot of light results in the generation of electrons and holes in a small region in the LEPSD 100. Each lateral current conducting layer, $LCCL_A$ 101 and $LCCL_B$ 104, can be characterized by a sheet resistance, preferably smaller than 500 Ohms per square and even more preferably smaller than 100 Ohms per square. When electrons produced from the illuminated spot diffuse into the $LCCL_A$ 101, they are then conducted to the two elongate electrical contacts 105 located at two opposite edges of the $LCCL_A$ 101. The $LCCL_A$ 101 acts like a resistive divider for the electron currents in the $LCCL_A$ 101 (see FIG. 2a). Likewise $LCCL_B$ 104 acts like a resistive divider for the electron currents in the $LCCL_B$ 104, which are associated with hole currents generated by the absorber layer 102 and conducted through the electron barrier layer 103. See FIG. 2a.

As the illuminated spot moves closer to elongate electrical contact 106 Y2, the value of resistance $R_{Y2}$ becomes smaller and the value of resistance $R_{Y1}$ becomes larger. Likewise, as the illuminated spot moves closer to elongate electrical contact 105 X1, the value of resistance $R_{X1}$ becomes smaller and the value of resistance $R_{X2}$ becomes larger. The positive photo-current $I_P$ is divided through resistances $R_{Y1}$ and $R_{Y2}$ and the negative photocurrent $-I_P$ is divided through resistances $R_{X1}$ and $R_{X2}$. For example, $I_{Y2}=I_P-R_{Y1}/(R_{Y1}+R_{Y2})$.

In one embodiment, the four output currents from the LEPSD 100 preferably are connected to trans-impedance amplifiers (TIAs), as illustrated in FIG. 2b. At a given elongate electrical contact 105 and 106, the LEPSD 100 has a frequency response bandwidth that is limited by the values of its equivalent parallel capacitance $C_D$ and its effective series resistance (which is the inter-electrode resistance $R_{Y1}+R_{Y2}$ or $R_{X1}+R_{X2}$).

In some embodiments, the frequency response bandwidth of the LEPSD 100 is larger than the desired or needed frequency response bandwidth of a sensor based on the LEPSD 100. Instead, that desired bandwidth can be set by the bandwidth of the TIAs. In that case, the noise associated with the combination of LEPSD 100 and TIAs can be reduced by making the values of the inter-electrode resistances (or the sheet resistances of $LCCL_A$ 101 and $LCCL_B$ 104) small, preferably smaller than 500 Ohms per square and even more preferably smaller than 100 Ohms per square.

Also, it is desirable to make the value of $C_D$ as small as practical, in order to increase the bandwidth of the frequency response, given the constraint on the desired size of the LEPSD 100. Thus, it is desirable for the LEPSD 100 to have a small capacitance per unit area. In an embodiment of the LEPSD 100, the capacitance is less than 100 $pF/mm^2$, and preferably is smaller than 50 $pF/mm^2$.

It also is desirable, to minimize the dark-current noise of the LEPSD 100. When the dark current is low, the value for the shunt resistance $R_o$ is large.

As shown in FIG. 2a, in some embodiments, a small reverse-bias voltage is applied to the LEPSD 100 between one of the two elongate electrical contacts 105 of $LCCL_A$ 101 and one of the two elongate electrical contacts 106 of $LCCL_B$ 104. The reverse-bias voltage directs a positive current out from contacts Y1 and Y2, with a corresponding positive current directed into elongate electrical contacts 105, X1 and X2.

Various known circuit designs could be used for the TIAs and are available from various commercial suppliers such as Thorlabs, Also, various known circuit designs, such as those based on operational amplifiers, could be used to implement the subtracting operation, the summing operation and the dividing operation such as described in the product literature by OSI Optoelectronics and also by Thorlabs, Pacific Silicon Sensor, Inc. and On-Trak Photonics, Inc. In some designs of the detector circuitry, the signal provided to the denominator input of the dividing circuit should have a positive value. Thus, the illustration in FIG. 1b uses the outputs from the Y1 and Y2 contacts for this denominator signal.

Figure 3:
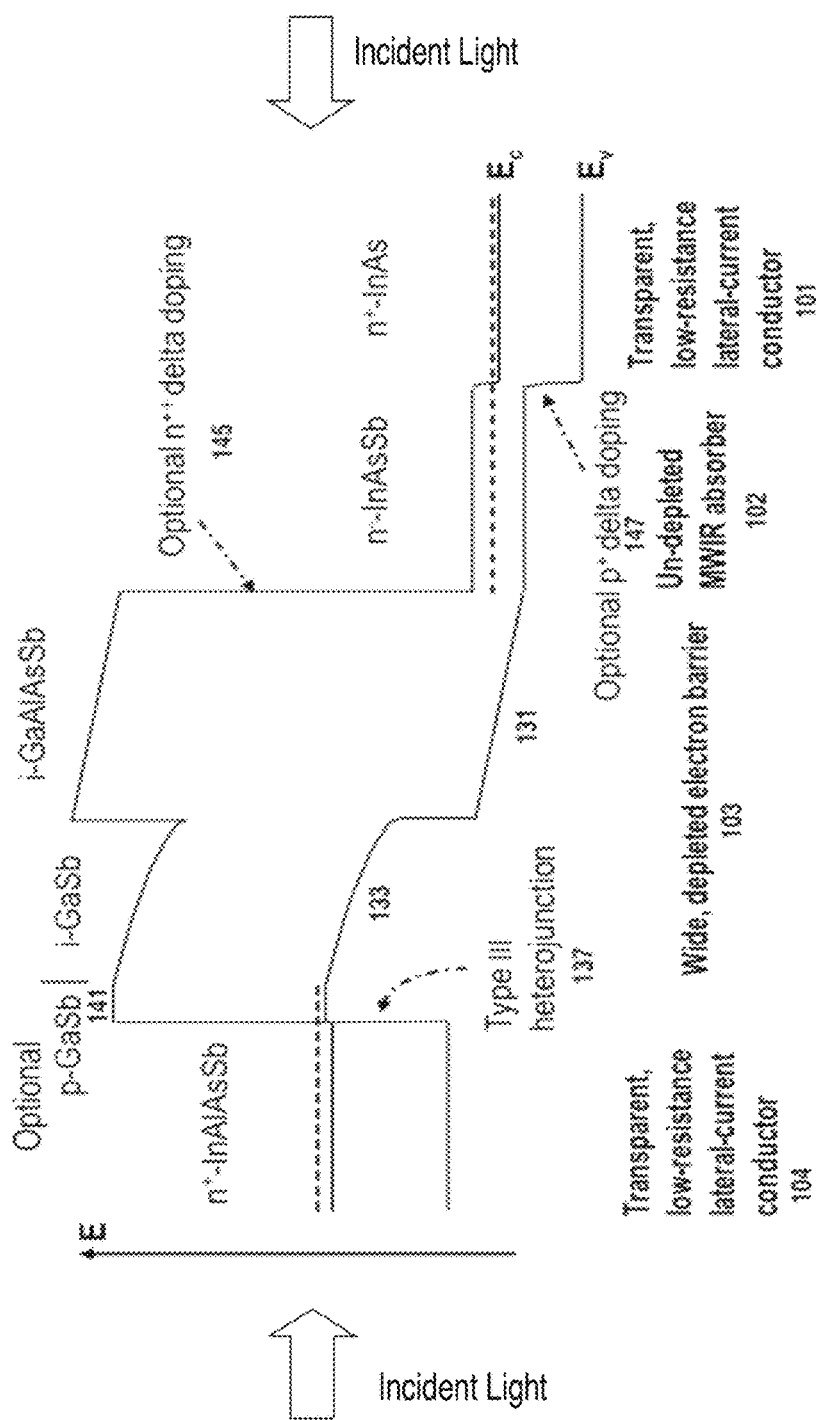
FIG. 3 illustrates an electronic band structure of the material used to fabricate an embodiment of the lateral-effect position-sensing detector of the present invention.

In some embodiments, the LEPSD 100 is implemented with the material structure depicted in FIG. 3. The structure has two $n^+$-doped, LCCLs that sandwich a wide depleted electron barrier layer 103 and an un-depleted SWIR or MWIR absorber layer 102. $LCCL_A$ 101 is adjacent to and abuts the SWIR or MWIR absorber layer 102. $LCCL_B$ 104 is on the opposite side of the electron barrier layer 103 from the absorber layer 102 with its first side 122 abutting the second side 123 of the electron barrier layer 103, with the locations of those sides indicated in FIG. 1e. In an embodiment of the LEPSD 100, where the optional p-type GaSb layer 141 is not present, the hetero-junction between the electron barrier layer 103 and the $LCCL_B$ 104 preferably forms a Type III hetero-junction 137. Preferably the material of the electron barrier layer 103 and n-type doping level of the $LCCL_B$ 104 material are selected to ensure the Fermi levels in those two layers are aligned. Thus, the holes in the electron barrier layer 103 can readily couple into electron states in the $LCCL_B$ 104. This structure can produce a LEPSD 100 that has the desired combination of low inter-electrode resistance, small capacitance per unit area and low dark current.

The incident light to be detected may initially impinge either on $LCCL_A$ 101 or $LCCL_B$ 104 depicted in FIG. 3. Of course, the installation of a reflector layer 111, if utilized, will constrain the incident light to impinging either $LCCL_A$ 101 or $LCCL_B$ 104 first depending on whether the reflector layer 111 (provided by reflector plates $112_1$-$112_4$) is formed adjacent $LCCL_A$ 101 or $LCCL_B$ 104. Of course, if pyramid shaped elements 153 are utilized, they would be formed adjacent the other one of $LCCL_A$ 101 or $LCCL_B$ 104.

In another embodiment (not shown) the hetero-junction between the $LCCL_B$ 104 and the electron barrier layer 103 preferably forms a staggered gap hetero-junction (herein Type II hetero-junction). For clarity, in a staggered gap Type II hetero-junction the valence band energy level of a first material at the material junction with a second material is above the valence band energy level of the second material but below the conduction band energy level of the second material and the conduction band energy level of the second material is below the conduction band energy level of the first material but above the valence band energy level of the first material. In a broken-gap Type III hetero-junction both the valence band energy level and the conduction band energy level of a first material at the material junction with a second material are below the valence band energy level, and therefore the conduction band energy level, of the second material.

Both $LCCL_A$ 101 and $LCCL_B$ 104 are preferably transparent to the SWIR or MWIR light to be absorbed by the absorber layer 102. Also, these LCCLs have preferably low resistance and preferably comprise $n^+$ type materials in the embodiment depicted in FIG. 3. The absorber layer 102 is an n-type material, preferably lightly doped. The materials of the electron barrier layer 103 are preferably un-doped, unintentionally doped or lightly doped. For clarity, an "intrinsic" material is an undoped semiconductor material without any significant dopant present (hence, the "un-doped, unintentionally doped or lightly doped" terminology used herein). Therefore, the property of the specific material itself is used to determine the number of charge carriers associated with an intrinsic (undoped) material. Thus, the structure of the LEPSD 100 can be described as a NIN structure.

Optionally, a p-type GaSb layer 141, shown in FIG. 3, is located between the $LCCL_B$ 104 and the electron barrier layer 103. This p-type GaSb layer 141 preferably forms a Type III hetero-junction with the material of the $LCCL_B$ 104. Preferably the p-type doping level of the p-GaSb layer 141 and the n-type doping level of the $LCCL_B$ material are selected to ensure the Fermi levels in those two layers are aligned. Thus, the holes in the p-GaSb layer can readily couple into electron states in the $LCCL_B$ 104. This structure can produce a LEPSD 100 that has the desired combination of low inter-electrode resistance, small capacitance per unit area and low dark current.

In another embodiment the hetero-junction between the $LCCL_B$ 104 and the p-type GaSb 141 layer forms a Type II hetero-junction.

In FIG. 3, the absorber layer 102 is an $n^-$-doped InAsSb material. The specific composition of this material can be adjusted to achieve absorption of light over a desired range of wavelengths at a given operating temperature. This material can be grown on substrate materials (similar to substrate 107 of FIG. 1e) such as GaSb and GaAs, as exemplified by the detector structures described in H. Sharifi, et al., "Fabrication of high operating temperature (HOT), visible to MWIR, nCBn photon-trap detector arrays," Proceedings of SPIE Vol. 8704, 87041U (2013) and A. I. D'Souza, et al., "MWIR InAs1−xSbx nCBn detectors data and analysis," Proceedings of SPIE Vol. 8353, paper 835333 (2012), both of which are incorporated herein by reference. As indicated earlier, the substrate material may be simply removed before completion of the device or, if transparent to the SWIR and/or MWIR light of interest, allowed to remain in the completed device.

The material comprising the $LCCL_A$ 101, which is depicted in FIG. 3 as $n^+$-doped InAs, preferably has a conduction band energy that is approximately equal to or lower than the conduction band energy of the material comprising the absorber layer 102. Since the $LCCL_A$ 101 is transparent to the light absorbed by the absorber layer 102, the band gap of the material comprising the $LCCL_A$ 101 is wider than the band gap of the material comprising the absorber layer 102. The range of wavelengths of the light detected by LEPSD 100 is constrained at the long-wavelength edge of that range by the band gap of the material comprising absorber layer 102 and is constrained at the short-wavelength edge of that range by the smallest band gap of materials comprising the $LCCL_A$ 101, the $LCCL_B$ 104 and the electron barrier 103. Thus, if the materials comprising $LCCL_A$ 101, $LCCL_B$ 104 and electron barrier 103 have sufficiently large band gap, the LEPSD 100 could detect not only MWIR light of wavelength between 3-5 μm but also some SWIR light of wavelength shorter than 3 μm.

The hetero-junction between the absorber layer 102 and the $LCCL_A$ 101, permits the flow of electrons from the absorber layer 102 into the $LCCL_A$ 101 but presents a potential-energy barrier to the flow of holes from the absorber layer 102 into the LCCL$_A$ 101. Some p-type delta doping can be applied in the vicinity of the hetero-junction between the absorber layer 102 and the LCCL$_A$ 101 to ensure that the absorber layer 102 is not depleted near that hetero-junction.

As also depicted in FIG. 3, an embodiment of the electron barrier layer 103 preferably consists of two different sub-layers, 131 and 133. The first sub-layer 131 abuts the absorber layer 102 and preferably comprises GaAlAsSb material, as shown. The composition of that GaAlAsSb material is chosen to be approximately lattice matched to the absorber layer material. Also, the composition of the first sub-layer material at an interface between the electron barrier layer 103 and the absorber layer 102 is chosen to have approximately the same valence band energy as the material of the absorber layer 102, such that a negligible barrier, preferably less than 0.1 Volt, is presented to the flow of holes between the absorber layer 102 and the first sub-layer 131 of the electron barrier layer 103.

The conduction band energy of the preferably GaAlAsSb material of the first sub-layer 131 is preferably much higher, preferably at least two times, and in many cases much more than two times, greater than the conduction band energy of the preferably InAsSb material in the absorber layer 102. Thus, the hetero-junction of the first sub-layer 131 and the absorber layer 102 presents a substantial barrier to the flow of electrons from the absorber layer 102 into the electron barrier layer 103. In fact, the conduction band energy of the electron barrier layer 103 is preferably so high that there is essentially no thermionic emission of electrons from the absorber layer 102 into the electron barrier layer 103. This can be achieved by adjusting, by techniques known to semiconductor fabricators, the mole concentrations of the GaAlAsSb material of the first sub-layer 131 relative to the mole concentrations of the InAsSb of the absorber layer 102.

In some embodiments, n$^{++}$-type delta doping 145 can be optionally applied in the vicinity of the hetero-junction between the absorber layer 102 and the electron barrier layer 103 to ensure that the absorber layer 102 is not depleted near that hetero-junction.

In an embodiment of the LEPSD 100, a second sub-layer 133 of the electron barrier layer 103, depicted in FIG. 3, is comprised preferably of GaSb material. In another embodiment, the second sub-layer 133 could be comprised of a material such a GaAlAsSb. In either case, the band gap of the second sub-layer 133 is smaller than the band gap of the material comprising the first sub-layer 131 but that also is approximately lattice matched to the material of the first sub-layer layer 131. This can be achieved by adjusting, by techniques known to semiconductor fabricators, the mole concentrations of the GaAlAsSb material of the first sub-layer relative to the mole concentrations of the GaSb or GaAlAsSb of the second sub-layer.

In an embodiment of the LEPSD 100, the LCCL$_B$ 104 preferably comprises a material such as n$^+$ doped InAlAsSb whose conduction band energy is approximately equal to or is lower than the valence band energy of the material comprising the second sub-layer of the electron barrier layer 103. Thus, a Type III (broken gap) hetero-junction 137 would be formed at the interface between the LCCL$_B$ 104 and the second sub-layer 133 of the electron barrier layer 103.

In another embodiment the hetero-junction between the LCCL$_B$ 104 and the second sub-layer forms a Type II (staggered gap) hetero-junction.

In some embodiments, a layer of a p-type material 141, such as GaSb, can be located between the second sub-layer 133 of the electron barrier layer 103 and the LCCL$_B$ 104. In such embodiments, this added p-type GaSb layer 141 forms the Type III hetero-junction 137 with the material of the LCCL$_B$ 104.

Preferably the p-type doping level of the p-GaSb layer 141 and the n-type doping level of the LCCL$_B$ 104 material are selected to ensure the Fermi levels in those two layers are aligned. Thus, the holes in the p-GaSb layer 141 can readily couple into electron states in the LCCL$_B$ 104.

At the interface between the first sub-layer 131 of the electron barrier layer 103 and the second sub-layer 133 of the electron barrier layer 103, as shown in FIG. 3, there can be a valence-band potential barrier that impedes the flow of holes from the second sub-layer 133 into the first sub-layer 131. Also, there can be a conduction-band potential barrier that impedes the flow of electrons from the second sub-layer 133 into the first sub-layer 131. Thus, any charge-carriers generated (thermally or by photon absorption) in the LCCL$_B$ 104 or in the second sub-layer 133 of the electron barrier layer 103 are directed to flow toward the elongate electrical contacts 106 of the LCCL$_B$ 104 rather than flowing through the absorber layer 102 and toward the elongate electrical contacts 105 of the LCCL$_A$ 101.

As previously mentioned, an external reverse-bias voltage preferably can be applied between one of the two elongate electrical contacts 105 of LCCL$_A$ 101 and one of the elongate electrical contacts 106 of the LCCL$_B$ 104. See FIG. 2a. This reverse-bias voltage can ensure that one or both sub-layers of the electron barrier layer 103 are depleted of free charge-carriers.

Preferably, the absorber layer 102 is sufficiently thick that most (e.g., >>50%) of the MWIR light to be detected by the LEPSD 100 would be absorbed after making two passes through the material of the absorber layer 102. In general, a thickness of 2 µm to 5 µm is acceptable, although an even greater thickness may be used.

The total thickness of the electron barrier layer 103 should be sufficient to achieve a desired capacitance per unit area for the LEPSD 100. In some embodiments, a thickness of 1.5 µm to 5 µm is preferred. In some embodiments, the capacitance per unit area of the LEPSD 100 is smaller than 100 pF/mm$^2$, and preferably is smaller than 50 pF/mm$^2$. The residual carrier concentration in the electron barrier layer 103 preferably is sufficiently low (e.g., below $2\times10^{16}$ cm$^{-3}$) that the entire electron barrier layer 103 can be depleted when a moderate reverse-bias voltage is applied.

The p-GaSb layer 141 at the interface between the electron barrier layer 103 and the LCCL$_B$ 104, if present, can be quite thin. A thickness of only 0.1 µm or less may be sufficient for establishing the Fermi level of holes at the Type III (broken gap) hetero-junction 137 interface or, in another embodiment, at the Type II (staggered gap) hetero-junction interface. In some embodiments, the optional p-GaSb layer 141 could be replaced by a thin delta-doped region.

The thickness of the LCCL$_A$ 101 and LCCL$_B$ 104 should be sufficient to achieve desired values of low sheet resistance for those two layers. Since those two layers can have fairly heavy n$^+$ type doping, with high electron mobility, in some embodiments a thickness of 0.25-1.0 µm may be sufficient for those layers.

Figure 4:
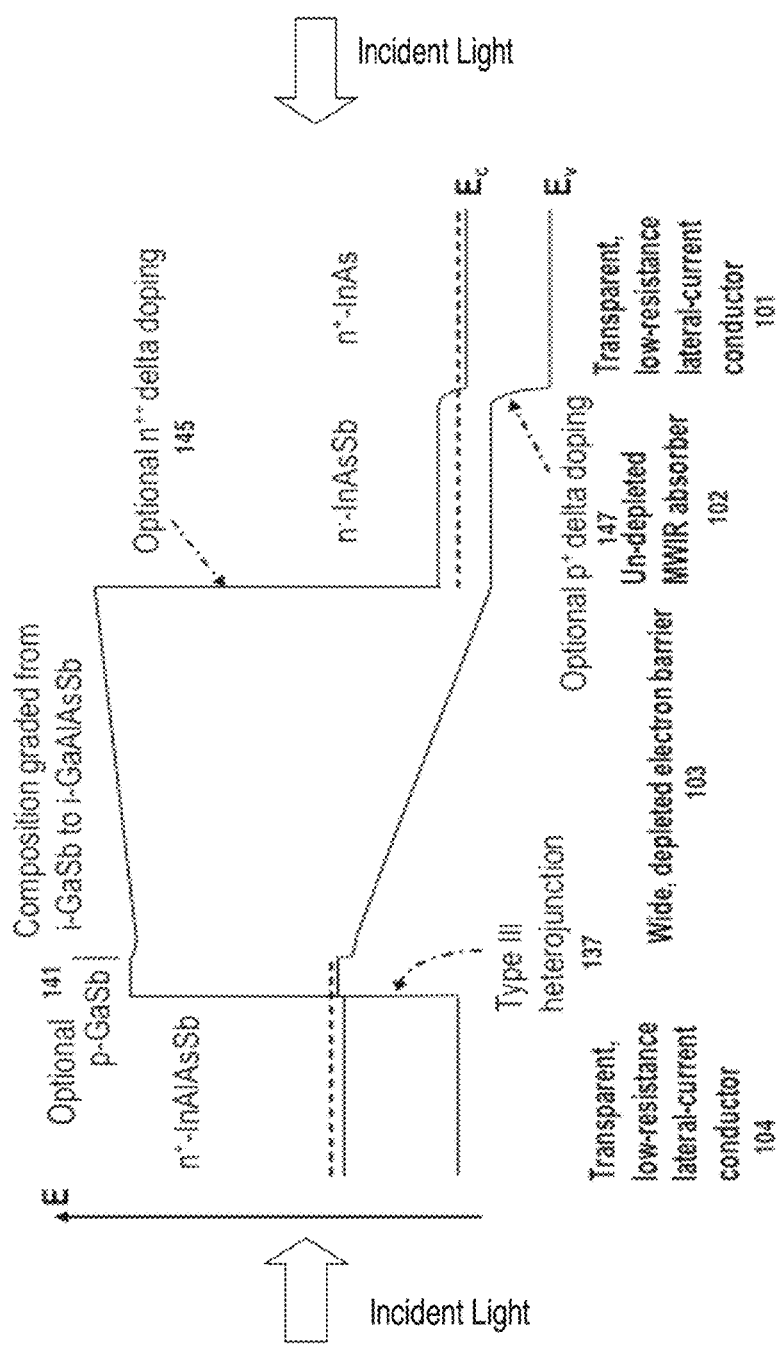
FIG. 4 illustrates an electronic band structure of the material used to fabricate another embodiment of the lateral-effect position-sensing detector of the present invention.

In another embodiment, the LEPSD 100 is implemented with the material structure depicted in FIG. 4. This material structure has a LCCL$_A$ 101, a MWIR absorber layer 102, an electron barrier layer 103, and a LCCL$_B$ 104. The design and materials composition of the LCCL$_A$ 101 and the absorber layer 102 of this structure are similar to the design and materials composition of the $LCCL_A$ 101 and absorber layer 102 of the structure of FIG. 3.

The materials of the electron barrier layer 103 for the structure depicted in FIG. 4 has a graded composition across the distance of the electron barrier layer 103 from the absorber layer 102 to $LCCL_B$ 104. At the interface of the electron barrier layer 103 with the absorber layer 102, the composition of the electron barrier layer material can be the same as the composition of the electron barrier layer material in the first sub-layer 131 of the electron barrier layer 103 in FIG. 3. As the distance in the electron barrier layer 103 from the absorber layer 102 increases, the composition of the electron barrier layer 103 is graded to gradually approach a GaSb or a GaInAlSb material that has approximately the same conduction band-edge energy as the conduction band-edge energy of GaSb. Thus, as the distance away from the absorber layer 102 and toward the $LCCL_B$ 104 is increased, the valence band energy of the graded electron barrier layer 103 gradually increases and the conduction band energy of the graded electron barrier layer 103 gradually decreases.

This can be achieved by adjusting the mole concentrations by techniques known to semiconductor fabricators. Alternatively, also by techniques known to semiconductor fabricators, the electron barrier layer 103 can be formed by alternating thin layers of GaInAlSb and GaSb, with layers closer to the hetero-junction with the absorber layer 102 having a larger concentration of GaInAlSb and those closer to the hetero-junction with the $LCCL_B$ 104 having a larger concentration of GaSb.

An electric field is thereby established in the electron barrier layer 103 that directs the holes to flow toward the $LCCL_B$ 104 and also directs the electrons present in the electron barrier layer 103 to flow toward the $LCCL_B$ 104. As a result, any carriers generated (thermally or by photon absorption) in the $LCCL_B$ 104 or in the graded electron barrier layer 103 are directed to flow toward the elongate electrical contact 106 of the $LCCL_B$ 104 rather than flowing through the absorber layer 102 and toward the elongate electrical contact 105 of the $LCCL_A$ 101.

An external reverse-bias voltage can be applied between an elongate electrical contact 105 of the $LCCL_A$ 101 and an elongate electrical contact 106 of the $LCCL_B$ 104. See FIG. 2a. This reverse-bias voltage can ensure that the electron barrier layer 103 is depleted of free carriers. The $LCCL_B$ 104 of the structure depicted in FIG. 4 is similar to the $LCCL_B$ 104 of the structure depicted in FIG. 3.

An optional layer of a p-type material 141, such as p-GaSb, may be located between the graded electron barrier layer 103 and the $LCCL_B$ 104. In some embodiments, the electron barrier layer 103 and the $LCCL_B$, or, alternatively, the p-GaSb layer 141 and the $LCCL_B$ 104, form a Type III hetero-junction 137. In other embodiments, interface between the electron barrier layer 103 and the $LCCL_B$ 104, or, alternatively, the p-GaSb layer 141 and the $LCCL_B$ 104, form a Type II hetero-junction. In either case, preferably the hole Fermi level near the edge of the graded electron barrier layer 103 adjacent the $LCCL_B$ 104 and the electron Fermi level in the $LCCL_B$ 104 are approximately aligned.

Alternatively, the hole Fermi level in the p-GaSb layer 141 and the electron Fermi level in the $LCCL_B$ 104 are preferably approximately aligned. Such an alignment permits the holes in the electron barrier layer 103 to couple into electron states of the $LCCL_B$ 104.

As in the case of FIG. 3, in FIG. 4 the incident light to be detected may initially impinge either on $LCCL_A$ 101 or $LCCL_B$ 104 depicted in FIG. 4. Of course, the installation of a reflector layer 111, if utilized, will constrain the incident light to impinging either $LCCL_A$ 101 or $LCCL_B$ 104 first depending on whether the reflector layer 111 (provided by reflector plates 112$_1$-112$_4$) is formed adjacent $LCCL_A$ 101 or $LCCL_B$ 104. And of course, if pyramid shaped elements 153 are utilized, they should be formed adjacent the other one of $LCCL_A$ 101 or $LCCL_B$ 104.

FIGS. 5a and 5b show cross-sectional illustrations of the LEPSD 100, as viewed from centerlines drawn along the y-axis and along the x-axis, for the Y-position cross-section and for the X-position cross-section, respectively. The two preferably elongate electrical contacts 106, Y1 and Y2, to the $LCCL_B$ 104 can be seen in the Y-position cross-section. The two preferably elongate electrical contacts 105, X1 and X2, to the $LCCL_A$ 101 can be seen in the X-position cross-section. In a preferred embodiment of the LEPSD 100, the elongate electrical contacts 105 and 106 could be formed using gold. FIGS. 5c and 5d are expanded views of areas around elongate electrical contacts 106 Y2 and 105 X2 as shown in FIGS. 5a and 5b, respectively.

Shown in FIGS. 5a and 5b (see also FIG. 1d) are the four triangular reflector plates 112 which serve as the optional reflector plate 111 and also preferably serve as metal bond pads since reflector plates 112$_1$ and 112$_2$ are in ohmic contact with $LCCL_B$ 104 thru electrical contacts 106 while since reflector plates 112$_3$ and 112$_4$ are in ohmic contact with $LCCL_A$ 101 thru electrical contacts 105 and metal posts 154. These triangular reflector plates 112$_1$-112$_4$ are preferably spaced from the $LCCL_B$ 104 by an oxide spacer 113 (and only plates 112$_1$ and 112$_2$ are ohmically coupled thereto at electrical contacts 106). These triangular reflector plates 112$_1$-112$_4$ are also spaced from each other by a dielectric filler 157 preferably disposed in gap 114 (see FIG. 1d). Two of the plates of 112 (plates 112$_1$ and 112$_2$) make electrical contact to layer 104, through 106 Y2 and 106 Y1. Two other plates (112$_3$ and 112$_4$ make electrical contact with layer 101, through 105 X2 and 105 X1 by means of metal posts 154. The four plates 112 are electrically isolated from each other and electrically coupled to the appropriate ends of the $LCCL_A$ 101 and $LCCL_B$ 104 layers at they respective bases 112B. The thickness of the oxide spacer 113 can range from 0.1 to 1 μm, and preferably that thickness is >0.3 μm so that little of the SWIR or MWIR light is absorbed in the oxide spacer 113. The triangular reflector plates 112 serve to preferably reflect the light not absorbed after a first pass through the material structure of the LEPSD 100 back for a second pass through the structure.

The metal posts 154 are in electrical contact with the elongate electrical contacts 105. In some embodiments, metal posts 154, as shown in FIG. 5b, also serve as optical reflectors. In embodiments where the metal reflector 111 is comprised of four triangular reflector plates 112, as shown in FIG. 1d, the reflector plates 112 can act as metal bond pads and the metal posts 154 may be in electrical contact with the one or more of the reflector plates 112.

In embodiments where the metal reflector 111 is a single, contiguous metal plate, as shown in FIG. 1c, the metal posts 154 are electrically separated from the metal reflector 111. Also, oxide spacer 113 separates the large metal reflector 111 from the $LCCL_B$ 104, as shown in FIG. 5c. In an embodiment of the LEPSD 100, an optional, dielectric filler material 155 can be used to insulate the metal and conducting portions of the LEPSD structure where required.

As shown in FIGS. 5a and 5b, an optional structure with pyramid shaped elements 153 can be located on the first side face 128 of the $LCCL_A$ 101. These pyramid shaped elements 153 form a pyramidal structure 151 and can be formed from any material of sufficiently large band gap that the MWIR light to be detected by the LEPSD 100 is not absorbed.

Preferably, the optical refractive index of the material comprising the pyramidal structure 151 is approximately equal to the refractive index of the materials in the absorber layer 102, the electron barrier layer 103 and the two LCCLs of the LEPSD 100. Although a matching value for the refractive index is preferred, lower values for the refractive index of the material comprising the pyramidal structure 151 also are acceptable.

The pyramid shaped elements 153 serve to enhance the coupling of the incident MWIR photons into the absorber layer 102, as discussed in W. Dai, D. Yap and G. Chen, "Wideband enhancement of infrared absorption in a direct band-gap semiconductor by using nonabsorptive pyramids," Optics Express, 20, A519-A529 (2012), which is incorporated herein by reference.

The pyramid shaped elements can be fabricated using methods such as those described H. Sharifi, et al., "Fabrication of high operating temperature (HOT), visible to MWIR, nCBn photon-trap detector arrays," Proceedings of SPIE Vol. 8704, 87041U (2013), and described in D. Yap, R. D. Rajavel, S. Mehta and J. S. Colburn, "Wide bandwidth infrared detector and imager," U.S. Pat. No. 7,928,389 B1 (2011) incorporated here by reference. Also, the elongate electrical contacts 105 and 106, the mesas defining the LEPSD 100, the oxide spacers and the metal reflectors 111 and metal posts 154 can be fabricated using methods such as those described in the same reference.

Although the pyramidal structure 151 is depicted in the embodiment of FIGS. 5a and 5b as abutting the $LCCL_A$ 101, in alternative embodiments, where the LEPSD 100 does not include a metal reflector 111, a pyramidal structure 151 could be located abutting the $LCCL_B$ 104 with the apexes of the pyramidal structure elements 153 facing toward the incident light and away from the face of $LCCL_B$ 104 and in still other embodiments pyramidal structures can be disposed on the faces of both LCCLs. In either case, the pyramidal structure is preferably located on the faces, 128 and 121, of the respective LCCL, with the apexes of the pyramids facing the incident light. In embodiments that include a metal reflector 111 the pyramidal structure 151 is located on the LEPSD face opposing the metal reflector 111.

In some embodiments, the LEPSD 100 detects the wavelengths of light preferably between a short-wavelength limit, as constrained by the $LCCL_A$ 101 band gap, and a long-wavelength limit, as constrained by the absorber layer 102 band gap. The material of the pyramid shaped elements 153 has a band gap preferably configured to enable the pyramid shaped elements 153 to absorb light of wavelengths shorter than the short-wavelength limit, thus allowing only longer wavelength light to pass through the LEPSD 100. The pyramidal structure 151 can be designed to achieve high absorbance of those wavelengths of light, as discussed H. Sharifi, et al., "Fabrication of high operating temperature (HOT), visible to MWIR, nCBn photon-trap detector arrays," Proceedings of SPIE Vol. 8704, 87041U (2013). Thus, only light having a wavelength longer than that short-wavelength upper limit is coupled into the absorber layer 102, electron barrier layer 103, $LCCL_A$ 101 and $LCCL_B$ 104 of the LEPSD 100. Where the pyramid structure 151 absorbs light at wavelengths shorter than the short wavelength limit, the electron barrier layer 103, $LCCL_A$ 101 and $LCCL_B$ 104 would need to be transparent only to light whose wavelength is longer than the short-wavelength upper limit.

In some embodiments, the sheet resistance of the $LCCL_A$ 101 and the sheet resistance of the $LCCL_B$ 104 preferably are each smaller than 500 Ohms per square and even more preferably are smaller than 100 Ohms per square. This low value of the sheet resistance allows the frequency response bandwidth of the LEPSD 100 to be higher.

In some embodiments, the capacitance per unit area of the LEPSD 100 is smaller than 100 $pF/mm^2$, and preferably is smaller than 50 $pF/mm^2$. This low value of the capacitance per unit area allows the LEPSD 100 to be larger and still achieve a given frequency response bandwidth.

LEPSDs 100 of the present disclosure allow the fabrication of high performance, low cost LEPSDs, which can be built in arrays of LEPSDs 100, by using III-V InAsSb epi and the barrier layers described above. The LEPSDs 100 according to the embodiments of FIGS. 1a-5 can operate in the mid-wave infrared wavelengths, which are about 3-5. µm.

The LEPSD 100 as disclosed herein may be operated at temperatures from 77 degrees Kelvin to 200 degrees Kelvin, which is much higher than the operating temperature possible with prior art position-sensing detectors. Such higher temperature operation further reduces the cost of a LEPSD system, because a cooling system of a prior art LEPSD 100 can be less expensive.

It has been shown by semiconductor fabricators that InAsSb epi with a mid-wave infrared wavelength cutoff of 5.25 µm can be grown on 6 inch substrate wafers, so LEPSD arrays according to the present disclosure may be built on large diameter wafers, which reduces cost.

Figure 6A:
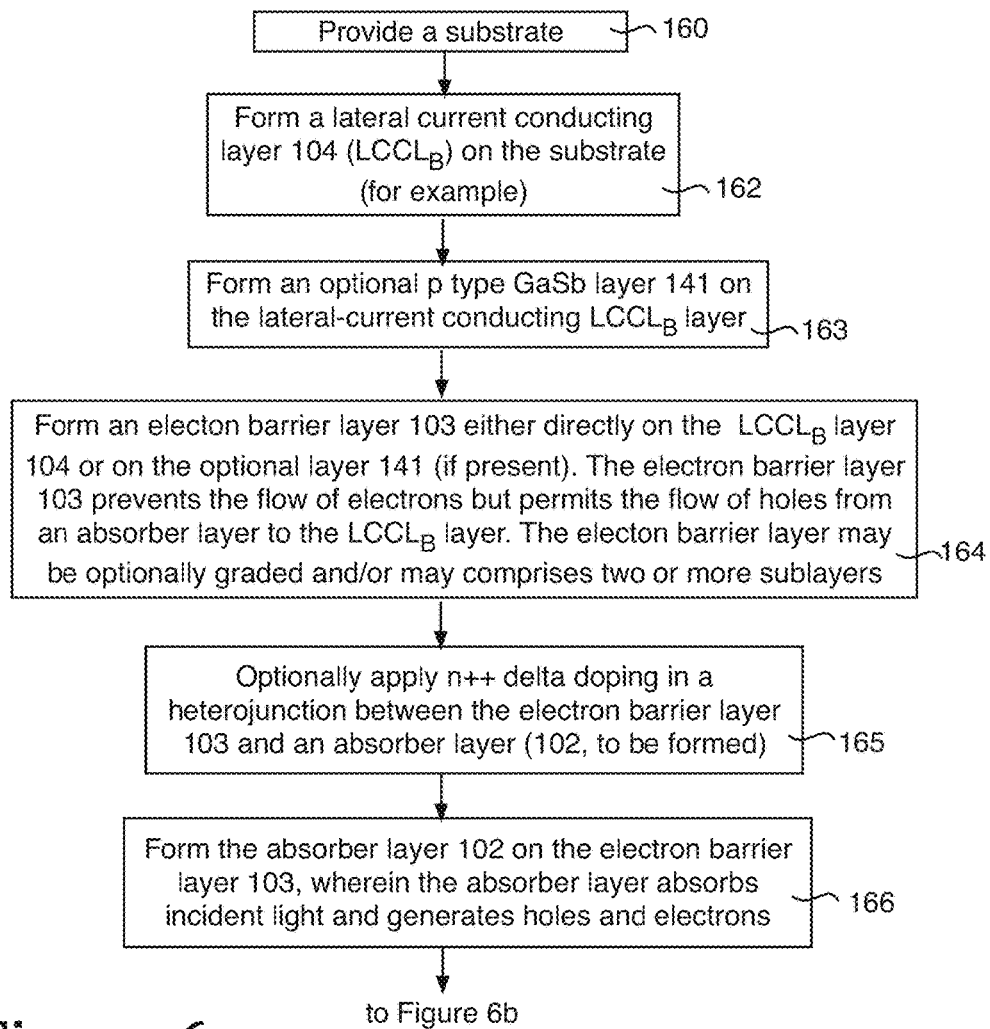
Figure 6B:
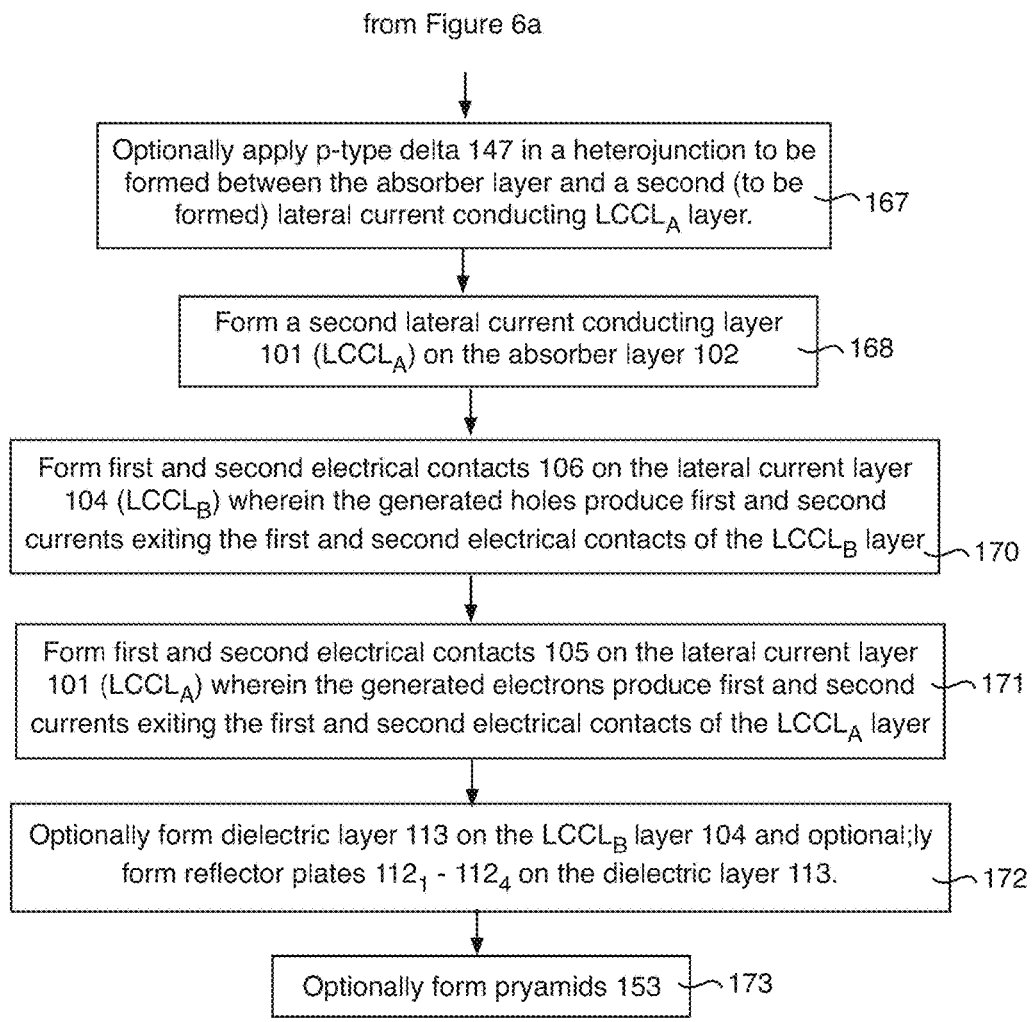

FIGS. 6a and 6b form a flow diagram of a method of providing and operating or using a LEPSD 100. Fabrication methods of semiconductor devices are known and are described in the above-cited article by Sharifi et al. and the patent by Yap et al.

FIG. 6c depicts steps which may be followed in utilizing the Lateral-Effect Position-sensing Detector of the present invention.

In step 160, a commercially available substrate is provided, preferably using materials, such as GaSb and GaAs as mentioned above or InAs or other suitable material. Then, in step 162, a lateral-current conducting layer ($LCCL_B$ 104) is formed, preferably on the just mentioned substrate. But as has been indicated earlier, the substrate could be used to start the fabrication using a different layer as the initial layer to be formed on the substrate. See FIG. 1e which shows an embodiment where the other lateral-current conducting layer ($LCCL_A$ 101) is formed on the substrate.

The substrate may either be removed or reduced in thickness (such as by grinding and/or etching) or allowed to remain in the completed device if transparent to the MWIR or SWIR light of interest. If the substrate is to be removed, then GaSb or GaAs would be preferable materials to use for the substrate. If it is to remain in whole or part, then InAs would be a preferable material to use for the substrate. Of course, others practicing this invention may opt to use some other material for the substrate as many different substrate materials as used in the semiconductor fabrication art.

The $LCCL_B$ 104 in one embodiment of the LEPSD 100 is formed preferably using InAlAsSb. The $LCCL_B$ 104 is preferably n+ doped. In some embodiments, the thickness of the $LCCL_B$ 104 formed on the substrate is calculated such that the inter-electrode resistance, or the sheet resistance, of the $LCCL_B$ 104 is small, preferably smaller than 500 Ohms per square. In other embodiments the thickness of the $LCCL_B$ 104 is calculated such that the inter-electrode resistance, or the sheet resistance, of the $LCCL_B$ 104 is preferably smaller than 100 Ohms per square. In some embodiments the thickness of the $LCCL_B$ 104 preferably is selected in a range between 0.25-1.0 μm.

In optional step 163, an optional GaSb layer of an embodiment of the LEPSD 100 is formed on the $LCCL_B$ 104. The optional GaSb layer is preferably p-doped. This GaSb layer preferably forms a Type III hetero-junction 137 with the material of the $LCCL_B$ 104. Preferably the p-type doping level of the p-GaSb layer 141 and the n+ type doping level of the $LCCL_B$ material are selected to ensure the Fermi levels in those two layers are aligned. Thus, the holes in the p-GaSb layer 141 can readily couple into electron states in the $LCCL_B$ 104. The $LCCL_B$ 104 preferably comprises a material whose conduction band energy is approximately equal to or is lower than the valence band energy of the material comprising the electron barrier layer 103, forming a Type III hetero-junction 137 at the interface between the $LCCL_B$ 104 and the optional p-GaSb layer 141.

Next, in step 164, in an embodiment not including the optional p-GaSb layer 141, an electron barrier layer 103 is formed on the $LCCL_B$ 104. If the optional p-GaSb layer 141 is present, in step 164 the electron barrier layer 103 is formed on the optional p-GaSb layer 141. The electron barrier layer 103 in one embodiment of the LEPSD 100 is formed preferably using GaSb, preferably un-doped, unintentionally doped or lightly doped and is preferably depleted or nearly depleted. In another embodiment of the LEPSD 100, the electron barrier layer 103 is formed preferably using GaAlAsSb, preferably un-doped, unintentionally doped or lightly doped and is preferably depleted or nearly depleted. In an embodiment of the LEPSD 100, the residual carrier concentration in the electron barrier layer 103 should be sufficiently low, i.e., below $2 \times 10^{16}$ cm$^{-3}$, that the entire electron barrier layer 103 can be depleted when a moderate reverse-bias voltage is applied. In some embodiments the total thickness of the electron barrier layer 103 is calculated to be sufficient to achieve a desired capacitance per unit area for the LEPSD 100. In some embodiments, the capacitance per unit area of the LEPSD 100 is smaller than 100 pF/mm$^2$, and preferably is smaller than 50 pF/mm$^2$. Preferably, an electron barrier is formed to a thickness chosen in a range between 1.5 μm to 5 μm. In one embodiment the material of the electron barrier layer 103 preferably forms a Type III hetero-junction 137 with the material of the $LCCL_B$ 104. Preferably, the intrinsic (undoped) material composition of the electron barrier layer 103 and the n+ type doping level of the $LCCL_B$ material are selected to ensure the Fermi levels in those two layers are aligned. Thus, the holes in the electron barrier layer 103 preferably can readily couple into electron states in the $LCCL_B$ 104. The $LCCL_B$ 104 preferably comprises a material whose conduction band energy is approximately equal to or is lower than the valence band energy of the material comprising the electron barrier layer 103, forming a Type III hetero-junction 137 at the interface between the $LCCL_B$ 104 and the electron barrier layer 103. The electron barrier layer 103 prevents a flow of electrons from the absorber layer 102 to the $LCCL_B$ 104, but permits the flow of holes from an absorber layer 102 to the $LCCL_B$ 104.

Optionally the electron barrier layer 103 may consist of two or more different sub-layers, for example layers 131 and 133 depicted on FIG. 3. In an embodiment of the LEPSD 100 (see FIG. 3), a second sub-layer 133 is formed on the $LCCL_B$ 104 and the first sub-layer 131 is formed on the second sub-layer 133. In another embodiment of the LEPSD 100, a second sub-layer 133 is formed on the optional p-GaSb layer 141 and the first sub-layer 131 is formed on the second sub-layer 133. The first sub-layer 131 abuts the absorber layer 102 and preferably comprises GaAlAsSb material. The composition of that GaAlAsSb material is chosen preferably to be approximately lattice matched to the absorber layer 102 material. Also, the composition of the first sub-layer 131 material at the interface between the electron barrier layer 103 and the absorber layer 102 is chosen to have approximately the same valence band energy as the material of the absorber layer 102, such that a negligible barrier, preferably less than 0.1v, is presented to the flow of holes between the absorber layer 102 and the first sub-layer 131 of the electron barrier layer 103. The composition of the preferably GaAlAsSb material of the first sub-layer 131 is selected such that conduction band energy of the first sub-layer 131 is preferably much higher, preferably at least two times, and in many cases much more than two times, greater than the conduction band energy of the preferably InAsSb material composition in the adjacent absorber layer 102. Thus, the hetero-junction of the first sub-layer 131 and the absorber layer 102 preferably presents a substantial barrier to the flow of electrons from the absorber layer 102 into the electron barrier layer 103. The conduction band energy of the electron barrier layer 103 is preferably so high that there is essentially no thermionic emission of electrons from the absorber layer 102 into the electron barrier layer 103. In an embodiment of the LEPSD 100, the second sub-layer 133 of the electron barrier layer 103 comprises preferably GaSb material. The second sub-layer 133 in another embodiment could comprise a material, such a GaAlAsSb, that has a smaller band gap than the material of the first sub-layer 131 but that also is approximately lattice matched to the material of the absorber layer 102. The $LCCL_B$ 104 preferably comprises a material such as n-doped InAlAsSb whose conduction band energy is approximately equal to or is lower than the valence band energy of the material comprising the second sub-layer of the electron barrier layer 103. Thus, a Type III heterojunction 137 would be formed at the interface between the $LCCL_B$ 104 and the second sub-layer 133 of the electron barrier layer 103.

Optionally still further the electron barrier layer 103 may consist of one or more graded electron barrier layers 103 formed across the distance of the electron barrier layer 103 from the absorber layer 102 to $LCCL_B$ 104 (as depicted on FIG. 4). The graded electron barrier layer(s) 103 is formed on $LCCL_B$ 104. If the optional p-GaSb layer 141 is present in step 163, the graded electron barrier layer 103 is formed on the p-GaSb layer 141. The compositional grade of the electron barrier layer 103 material can progress from being GaSb material at the hetero-junction with $LCCL_B$ 104 (or at the interface of the graded region with p-GaSb layer 141) and gradually have additional AsAs incorporated with the GaSb forming a GaAlAsSb material. At its interface with the $LCCL_B$ 104, GaSb material of appropriate doping is preferred such that a Type III hetero-junction 137 is formed with the $LCCL_B$ 104. Progressing from the interface with $LCCL_B$ 104 and toward the interface with absorber 102, the GaAlAsSb material in electron barrier 103 has increasingly more AlAs and less GaSb content. As its composition is being graded, the mole concentrations also are adjusted such that the GaAlAsSb material remains approximately lattice matched with an n-type InAsSb material of the absorber layer 102.

For example, the material in the electron barrier 103 may comprise $Ga_w Al_x As_y Sb_z$ at the interface with the absorber 102, GaSb at the interface with $LCCL_B$ 104, and $Ga_{w+d} Al_{x-e} As_{y-f} Sb_{z+g}$ in the region between the interface with absorber 102 and the interface with $LCCL_B$ 104. According to commonly practiced notation, w+d=1 and z+f=1 for GaSb. Also, w, x, y and z all have values smaller than 1. And, w+x=1, and y+z=1. Furthermore, w+d+x−e=1, and z+g+y−f=1. The plus and minus signs in and $Ga_{w+d}Al_{x-e}As_{y-f}Sb_{z+g}$ are assigned assuming the values for d, e, f and g are positive. As the Ga content goes up, the Al content goes down in proportion. Likewise, as the Sb content goes up, the As content goes down, in proportion.

At its interface with the absorber layer 102, the GaAlAsSb material preferably has a composition whose valence band edge has approximately the same energy as the valence band edge of the n-type InAsSb material of the absorber layer 102. The conduction band energy of the GaAlAsSb material at this interface between the compositionally graded electron barrier 103 and the absorber layer 102 is much higher than the conduction band energy of the n-type InAsAs material of the absorber layer 102. Therefore, an energy barrier is formed that hinders the flow of electrons from absorber layer 102 into barrier layer 103. As the distance in the graded electron barrier layer 103 from the absorber layer 102 increases, the composition of the electron barrier layer 103 is preferably chosen such that the valence band energy of the graded electron barrier layer 103 gradually increases and the conduction band energy of the graded electron barrier layer 103 gradually decreases.

Next, in optional Step 165, in some embodiments of the LEPSD 100, preferably $n^{++}$ type delta doping 145 can be optionally applied in the vicinity of the hetero-junction formed between the absorber layer 102 and the electron barrier layer 103 to ensure that the absorber layer 102 is not depleted near that hetero-junction. In other embodiments, $p^+$ type delta doping 147 can be optionally applied in the vicinity of the hetero-junction between the absorber layer 102 and the first sub-layer 131 of the electron barrier layer 103 to ensure that the absorber layer 102 is not depleted near that hetero-junction.

Then, in step 166, in an embodiment of the LEPSD 100, the absorber layer 102 is formed on the electron barrier layer 103. In another embodiment, the absorber layer 102 is formed on the first sub-layer 131 of the electron barrier layer 103. The junction formed in step 166 may be optionally $n^{++}$ delta-doped 145. The absorber layer 102 in an embodiment of the LEPSD 100 is formed preferably using n-type InAsSb, preferably lightly doped. In some embodiments, the absorber layer 102 thickness would be chosen preferably from the range of 2 μm to 5 μm. In other embodiments the absorber layer 102 thickness would be greater thickness than 5 μm. In embodiments where a metal reflector 111 is present, the absorber layer 102 thickness is calculated such that it is sufficiently thick that most, i.e. more than fifty percent, of the MWIR light to be detected by the LEPSD 100 would be absorbed after making two passes through the material of the absorber layer 102. In embodiments where a metal reflector 111 is not present, the choice of the absorber layer 102 thickness is calculated such that it is sufficiently thick that most, i.e. more than fifty percent, of the MWIR light to be detected by the LEPSD 100 would be absorbed after making a single pass through the material of the absorber layer 102. The absorber layer 102 absorbs incident light and generates holes and electrons.

In an optional step 167, in an embodiment of the LEPSD 100, $p^+$ type delta doping 147 is applied in the vicinity of the hetero-junction between the absorber layer 102 and the $LCCL_A$ 101 to ensure that the absorber layer 102 is not depleted near that hetero-junction.

Next, in step 168, the second lateral-current conducting layer ($LCCL_A$ 101) is formed on the absorber layer 102. The hetero-junction formed in step 168 may be optionally p-doped 143 as in step 167. In an embodiment of the LEPSD 100, the material comprising the $LCCL_A$ 101 preferably has a conduction band energy that is approximately equal to or lower than the conduction band energy of the material comprising the absorber layer 102. The material of the $LCCL_A$ 101 is preferably transparent to the light absorbed by the absorber layer 102. The composition material comprising the $LCCL_A$ 101 is selected such that the band gap of the $LCCL_A$ 101 material is preferably wider than the band gap of the material comprising the absorber layer 102. The $LCCL_A$ 101, in one embodiment of the LEPSD 100, is formed preferably using InAs. The $LCCL_A$ 101 is preferably $n^+$ doped. In some embodiments, the thickness of the $LCCL_A$ 101 is calculated such that the inter-electrode resistance, or the sheet resistance, of the $LCCL_A$ 101 is small, preferably smaller than 500 Ohms per square. In other embodiments the thickness of the $LCCL_B$ 104 is calculated such that the inter-electrode resistance, or the sheet resistance, of the $LCCL_B$ 104 is preferably smaller than 100 Ohms per square. In some embodiments the thickness of the $LCCL_A$ 101 preferably is selected in a range between 0.25-1.0 μm.

Next, in step 170, two elongate electrical contacts 106 are formed on opposite edges of the face 121 of the $LCCL_B$ 104 along an y-axis relative to the plane of the face 121 of the $LCCL_B$ 104 and passing through the center 157 of the $LCCL_B$ 104, as shown in FIG. 1c. The holes generated in the absorber layer 102, as a consequence of the incident light, produce first and second currents exiting the first and second electrical contacts of the $LCCL_B$ 104.

In step 171, two elongate electrical contacts 105 are formed on opposite edges of the face 128 of the $LCCL_A$ 101 along a x-axis perpendicular to the y-axis and passing through the center 157 of the $LCCL_A$ 101, as shown in FIG. 1c. The electrons generated in the absorber layer 102, as a consequence of the incident light, produce first and second currents exiting the first and second electrical contacts of the $LCCL_A$ 101. Step 171 may, of course, may be performed before step 170 if desired.

The reflector plates $112_1$-$112_4$ (see step 172) and pyramid shaped elements 155 (see step 173) may be formed now or at some other convenient point, following, for example, the techniques described in U.S. patent application Ser. No. 13/372,366, filed on Feb. 13, 2012 referenced above.

As shown by block 180 on FIG. 6c, the LEPSD 100 formed by the $LCCL_B$, the electron barrier layer, the absorber layer and the $LCCL_A$, or one of the optional embodiments, is sensitive to a lateral position between each of the first elongate electrical contact 106 and the second elongate electrical contact 106 of $LCCL_B$ 104 and between each of the first elongate electrical contact 105 and the second elongate electrical contact 105 of $LCCL_A$ 101, respectively, as caused by an electrical current on $LCCL_B$ 104 and $LCCL_A$ 101 derived from photovoltaic current created by incident light passing through the absorber layer 102.

In use, as represented by block 181 the lateral positions X and Y of the incident light are determined by calculating $X=0.5L_X*(I_{X2}-I_{X1})/(I_{X2}+I_{X1})$ and $Y=0.5L_Y*(I_{Y2}-I_{Y1})/(I_{Y2}+I_{Y1})$, respectively, where $L_X$ and $L_Y$ is a distance between each first contact and second contact of $LCCL_A$ 101 and $LCCL_B$ 104, respectively, where $I_{X1}$ is a current at the first contact 105 X1 and $I_{X2}$ is a current at the second contact 105 X2 of $LCCL_A$ 101 and where $I_{Y1}$ is a current at the first contact 106 Y1 and $I_{y2}$ is a current at the second contact 106 Y2 of $LCCL_B$ 104. See FIG. 1*b*.

Also in use, as represented by block 182, the intensity of the incident light on the absorber layer 102 is determined by summing the first and second currents exiting the second lateral current conducting layer $LCCL_B$ 104 or summing the first and second currents exiting the lateral current conducting layer $LCCL_A$ 101.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims.

No claim element herein is to be construed under the provisions of 35 U.S.C. Sec. 112, sixth paragraph, unless the element is expressly recited using the phrase "means for." and no method or process step herein is to be construed under those provisions unless the step, or steps, are expressly recited using the phrase "comprising the step (s) of . . . ".

What is claimed is:

1. A lateral effect position-sensing detector of incident light comprising:
   a first lateral-current conducting layer comprising a $n^+$-type semiconductor material disposed on an absorber layer comprising an n-type semiconductor material;
   an electron barrier layer disposed on the absorber layer opposite the first lateral current conducting layer, the electron barrier layer comprising two or more semiconductor layers; and
   a second lateral-current conducting layer comprising an $n^+$-type semiconductor material disposed on the electron barrier layer opposite the absorber layer.

2. The lateral effect position-sensing detector of claim 1 wherein:
   the electron barrier layer is substantially depleted of free charge carriers.

3. The lateral effect position-sensing detector of claim 1 wherein:
   a band structure at the interface between the electron barrier layer and the second lateral-current conducting layer exhibit a broken-gap Type III hetero-junction.

4. The lateral effect position-sensing detector of claim 3 wherein:
   a p-delta doped region is located at the Type III hetero-junction.

5. The lateral effect position-sensing detector of claim 1 further comprising:
   a p-doped layer disposed between the second lateral-current conducting layer and the electron barrier layer, wherein an interface between the p-doped layer and the second lateral-current conducting layer exhibits a broken-gap Type III hetero-junction.

6. The lateral effect position-sensing detector of claim 5 wherein:
   the p-doped layer is a semiconductor material comprising GaSb.

7. The lateral effect position-sensing detector of claim 1 wherein:
   an interface between the absorber layer and the first lateral-current conducting layer form a hetero-junction; and
   wherein the interface further comprises $p^+$-delta doping.

8. The lateral effect position-sensing detector of claim 1 wherein:
   an interface between the absorber layer and the electron barrier layer is $n^{++}$ delta doped.

9. The lateral effect position-sensing detector of claim 1 wherein:
   a valence band energy level of the electron barrier layer semiconductor materials is approximately equal to a valence band energy level of the semiconductor materials comprising the absorber layer; and
   wherein a conduction band energy level of the electron barrier layer is more than twice a conduction band energy level of the absorber layer.

10. The lateral effect position-sensing detector of claim 1 wherein:
    the absorber layer comprising at least one member of the group consisting of InAsSb and InAs,
    the electron barrier layer comprises GaInSb, AlAsSb, AlInAsSb, GaSb, GaAlSb or GaAlAsSb,
    the first lateral-current conducting layer comprising semiconductor materials being at least one member of the group consisting of InAs, InAsSb and InAlAsSb,
    the second lateral-current conducting layer comprising semiconductor materials being at least one member of the group consisting of InAs, InAlAsSb and InAsSb.

11. The lateral effect position-sensing detector of claim 1 wherein:
    the absorber layer has a thickness between 2 micrometers and 5 micrometers; and
    the electron barrier layer has a thickness between 1.5 micrometers and 5 micrometers.

12. The lateral effect position-sensing detector of claim 1 wherein:
    the electron barrier layer has a thickness greater than 5 micrometers.

13. The lateral effect position-sensing detector of claim 1 wherein:
    the electron barrier layer comprises a first sub-layer and a second sub-layer, wherein the first sub-layer forms a hetero-junction with the absorber layer,
wherein the second sub-layer forms a broken-gap Type III hetero-junction with the second lateral-current conducting layer,
wherein the semiconductor materials of both the first sub-layer and the second sub-layer have a conduction band energy level that is higher than a conduction band energy level of the semiconductor materials comprising the absorber layer and is higher than the conduction band energy level of the semiconductor materials comprising the second lateral-current conducting layer, and
wherein the valence band energy levels of the semiconductor materials of both the first sub-layer and the second sub-layer are equal to or greater than the valence band energy level of the semiconductor materials of the absorber layer.

14. The lateral effect position-sensing detector of claim 1 wherein:
the two or more semiconductor materials of the electron barrier layer is a graded composition of $Ga_wAl_xAs_ySB_z$ disposed nearest to the absorber layer;
wherein the semiconductor materials in the graded composition electron barrier layer at approximately half way through the electron barrier layer is comprised of $Ga_{w+d}Al_{x-e}As_{y-f}Sb_{z+g}$,
wherein such compositions of GaAlAsSb have incrementally changing mole fractions in a range between $Ga_wAl_xAs_ySb_z$ and $Ga_{w+d}Al_{x-e}As_{y-f}Sb_{z+g}$
wherein d, e, f, g, w, x, y, and z are less than or equal to 1,
w+d=1, z+f=1, w+x=1, y+z=1, w+d+x−e=1, and z+g+y−f=1; and
the semiconductor materials in the graded composition electron barrier layer at the portion of the electron barrier layer located nearest to the second lateral-current conducting layer is comprised of GaSb.

15. The lateral effect position-sensing detector of claim 1 further comprising:
an oxide spacer disposed on a the second lateral-current conducting layer; and a metal reflector disposed on the oxide spacer.

16. The lateral effect position-sensing detector of claim 15 wherein:
the oxide spacer has a thickness greater than 0.3 micrometers.

17. The lateral effect position-sensing detector of claim 15 wherein:
the metal reflector is comprised of four triangular reflector plates;
wherein the triangular reflector plates are physically separated and electrically isolated from each other by a dielectric filler; and
two metal posts disposed between the first lateral-current conducting layer and the metal reflector and at two opposing edges of the lateral effect position-sensing detector;
wherein the metal posts are in electrical contact with at least two of the triangular reflector plates and with two elongate electrical contacts of the first lateral-current conducting layer; and
wherein the four triangular reflector plates act as metal bonding pads.

18. The lateral effect position-sensing detector of claim 1 wherein:
the lateral effect position-sensing detector includes one or more pyramid shaped elements;
wherein each of the one or more pyramid shaped elements has an apex and a base;
wherein the apex is positioned closest to the incident light and furthest from the absorber; and
wherein an optical refractive index of the one or more materials comprising the pyramid shaped elements is approximately equal to or less than a refractive index of the one or more materials in the absorber layer, the electron barrier layer, and the first and second lateral-current conducting layers;
the bases of the one or more pyramid shaped elements abut one or both sides of the lateral-current conducting layers.

19. The lateral effect position-sensing detector of claim 1 further comprising:
a substrate;
wherein the first lateral-current conducting layer is disposed on the substrate; and
the substrate comprising materials being at least one member of the group consisting of GaSb and GaAs.

20. The lateral effect position-sensing detector of claim 1 wherein: the thickness of the electron barrier layer is greater than 1.5 micrometers; and
the n-type semiconductor material of the absorber is unintentionally doped or lightly doped.

21. A method of fabricating lateral effect position-sensing detector comprising:
forming a first lateral-current conducting layer;
forming an absorber layer on the first lateral-current conducting layer;
forming an electron barrier layer on the absorber layer;
forming a second lateral-current conducting layer on the electron barrier layer; and
wherein the electron barrier layer comprises two or more semiconductor materials.

22. The method of claim 21 wherein:
the first and second lateral-current conducting layers comprise $n^+$-type doped semiconductor materials;
the absorber layer comprises an n-type semiconductor materials that are unintentionally doped or lightly doped.

23. The method of claim 21 wherein the electron barrier layer comprises:
a first sub-layer of GaAlAsSb material nearest the absorber layer
a second sub-layer of GaSb material nearest the second lateral-current conducting layer;
wherein the GaSb material is chosen to create a Type III hetero-junction with the second lateral-current conducting layer;
wherein the first sub-layer of the electron barrier layer forms a hetero-junction with the absorber layer, and
wherein the first sub-layer is approximately lattice matched to the absorber layer material; and
the hetero-junction between the absorber layer and the first sub-layer of the electron barrier layer is $n^{++}$-type delta doped.

24. The method of claim 21 further comprising:
forming one or more pyramid shaped elements on the first lateral-current conducting layer;
wherein the pyramid shaped elements have an apex and a base;
positioning the apex closest to the incident light, and
wherein the optical refractive index of the one or more materials comprising the pyramid shaped elements is approximately equal to or less than the refractive index of the one or more materials in the absorber layer, the electron barrier layer and the first and second lateral-current conducting layers.

25. The method of claim 21 further comprising:
forming an optical spacer with a thickness greater than 0.3 micrometers on the second lateral-current conducting layer;
forming a metal reflector on the optical spacer substrate;
wherein the metal reflector is electrically isolated from the remainder of the lateral effect position-sensing detector.

26. The method of claim 25 further comprising:
forming the metal reflector as four triangular reflector plates;
wherein the triangular reflector plates are separated from each other by oxide spacers; and
wherein the four triangular reflector plates act as metal bonding pads.

27. A sensor comprising:
a lateral effect position-sensing detector of incident light; and
four transimpedance amplifiers,
wherein the lateral-effect position-sensing detector comprising
a first lateral-current conducting layer having two elongate electrical contacts, X1 and X2,
a second lateral-current conducting layer having two elongate electrical contacts, Y1 and Y2,
an absorber layer, and
an electron barrier layer,
wherein each of the elongate electrical contacts of the lateral effect position-sensing detector are electrically connected to a transimpedance amplifier, and
wherein four output currents $I_{X1}$, $I_{X2}$, $I_{Y1}$ and $I_{Y2}$ at electrical contacts X1, X2, Y1 and Y2 result in transimpedance currents A, B, C and D, respectively, at the outputs of the four transimpedance amplifiers.

28. A lateral effect position-sensing detector of incident light comprising:
a lateral-current conducting layer having a first major surface or side and a second major surface or side, having a conducting layer comprising a doped semiconductor material;
an absorber layer comprising a doped semiconductor material;
wherein the absorber layer having a first major surface or side and a second major surface or side, the first major surface or side of the absorber layer being disposed on or adjacent the second major surface or side of the first lateral-current conducting layer; and
wherein the absorber layer absorbs the incident light and generates electrons and holes;
an electron barrier layer comprising two or more semiconductor materials, the electron barrier layer having a first major surface or side and a second major surface or side, the first major surface or side of the electron barrier layer being disposed on or adjacent the second major surface or side of the absorber layer, the electron barrier layer inhibiting a flow of electrons from the absorber layer into the electron barrier layer but permits a flow of holes from the absorber layer into the electron barrier layer; and
another lateral-current conducting layer comprising a doped semiconductor material, the another lateral-current conducting layer having a first major surface or side and a second major surface or side, wherein the first major surface or side of the another lateral-current conducting layer is disposed on or adjacent the second major surface or side of the electron barrier layer.

29. The lateral effect position-sensing detector of incident light of claim 28 wherein the absorber layer includes n-type semiconductor material and the first mentioned and another lateral-current conducting layers each comprise $n^+$-type semiconductor material.

30. The method of claim 21 further comprising:
forming an electrical contact to the first lateral-current conducting layer; and
forming an electrical contact to the second lateral-current conducting layer.

31. The sensor according to claim 27 wherein the absorber layer absorbs the incident light and generates electrons and holes, and wherein the electron barrier layer prevents the flow of electrons from the absorber layer into the electron barrier layer but permits the flow of holes from the absorber layer into the electron barrier layer, and wherein the electrons prevented from flowing from the absorber layer and the holes permitted to flow into the electron barrier layer create output currents $I_{X1}$, $I_{X2}$, $I_{Y1}$ and $I_{Y2}$, at each of the four electrical contacts X1, X2, Y1 and Y2, respectively.

32. The sensor according to claim 31 wherein a lateral position X of the incident light is determinable by calculating X=(A−B)/(C+D); and
a lateral position Y of the incident light is determinable by calculating Y=(C−D)/(C+D).

* * * * *